US012581969B2

(12) United States Patent
Kadoguchi et al.

(10) Patent No.: US 12,581,969 B2
(45) Date of Patent: Mar. 17, 2026

(54) SEMICONDUCTOR DEVICE

(71) Applicant: DENSO CORPORATION, Kariya (JP)

(72) Inventors: Takuya Kadoguchi, Toyota (JP);
Takanori Kawashima, Toyota (JP);
Shinji Hiramitsu, Kariya (JP);
Shoichiro Omae, Kariya (JP)

(73) Assignee: DENSO CORPORATION, Kariya-city
(JP)

( * ) Notice: Subject to any disclaimer, the term of this
patent is extended or adjusted under 35
U.S.C. 154(b) by 788 days.

(21) Appl. No.: 17/886,857

(22) Filed: Aug. 12, 2022

(65) Prior Publication Data

US 2022/0392834 A1      Dec. 8, 2022

Related U.S. Application Data

(63) Continuation of application No.
PCT/JP2020/005878, filed on Feb. 14, 2020.

(51) Int. Cl.
*H01L 23/34*          (2006.01)
*H01L 21/48*          (2006.01)
(Continued)

(52) U.S. Cl.
CPC .... *H01L 23/49838* (2013.01); *H01L 21/4853*
(2013.01); *H01L 21/4857* (2013.01); *H01L
23/34* (2013.01); *H01L 23/49811* (2013.01);
*H01L 23/5386* (2013.01); *H01L 23/5389*
(2013.01); *H01L 24/05* (2013.01);
(Continued)

(58) Field of Classification Search
CPC .............. H01L 23/34; H01L 23/49811; H01L 23/5386; H01L 23/5389; H01L 25/072;
H01L 2224/06051; H01L 2224/06181;
H01L 2224/16225; H01L 2224/32225;
H01L 2224/33181; H01L 2924/13055;
(Continued)

(56) References Cited

U.S. PATENT DOCUMENTS

2004/0195649 A1* 10/2004 Miura .................... H01L 25/072
257/E23.092
2008/0029297 A1* 2/2008 Nakamura ............ H01L 21/563
257/E23.07
(Continued)

FOREIGN PATENT DOCUMENTS

EP          3 188 232 A1      7/2017
JP          2009-158787 A      7/2009
(Continued)

*Primary Examiner* — Marlon T Fletcher
*Assistant Examiner* — Hamna Fathima Iqbal
(74) *Attorney, Agent, or Firm* — Posz Law Group, PLC

(57) ABSTRACT

A semiconductor device includes a semiconductor element
having a surface on which a first electrode and a second
electrode are disposed, a conductor plate having a surface
facing the surface of the semiconductor element and elec-
trically connected to the first electrode, an insulating layer
disposed on the surface of the conductor plate and covers a
part of the surface of the conductor plate, and a conductor
circuit pattern disposed on the insulating layer. The conduc-
tor circuit pattern has at least one conductor line electrically
connected to the semiconductor element. The at least one
conductor line includes a conductor line electrically con-
nected to the second electrode.

20 Claims, 21 Drawing Sheets

(51) Int. Cl.
    H01L 23/00       (2006.01)
    H01L 23/498     (2006.01)
    H01L 23/538     (2006.01)
    H01L 25/07      (2006.01)

(52) U.S. Cl.
    CPC ............ H01L 24/06 (2013.01); H01L 25/072 (2013.01); *H01L 24/16* (2013.01); *H01L 24/27* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 2224/05552* (2013.01); *H01L 2224/05554* (2013.01); *H01L 2224/0603* (2013.01); *H01L 2224/06051* (2013.01); *H01L 2224/0616* (2013.01); *H01L 2224/06181* (2013.01); *H01L 2224/16225* (2013.01); *H01L 2224/27849* (2013.01); *H01L 2224/32225* (2013.01); *H01L 2224/33181* (2013.01); *H01L 2224/73203* (2013.01); *H01L 2224/73253* (2013.01); *H01L 2224/81815* (2013.01); *H01L 2224/83815* (2013.01); *H01L 2224/9211* (2013.01); *H01L 2224/92225* (2013.01); *H01L 2924/13055* (2013.01)

(58) Field of Classification Search
    CPC ........... H01L 23/3107; H01L 23/49531; H01L 23/49575
    See application file for complete search history.

(56)               References Cited

U.S. PATENT DOCUMENTS

| | | |
|---|---|---|
| 2018/0102302 A1 | 4/2018 | Grassmann et al. |
| 2019/0237381 A1 | 8/2019 | Kawashima |

FOREIGN PATENT DOCUMENTS

| | | |
|---|---|---|
| JP | 2013-110216 A | 6/2013 |
| JP | 2016-066700 A | 4/2016 |

* cited by examiner

SEMICONDUCTOR DEVICE

CROSS REFERENCE TO RELATED APPLICATIONS

The present application is a continuation application of International Patent Application No. PCT/JP2020/005878 filed on Feb. 14, 2020, which designated the U.S. The entire disclosures of the above application is incorporated herein by reference.

TECHNICAL FIELD

The present disclosure relates to a semiconductor device.

BACKGROUND

There has been known a semiconductor device that includes a semiconductor element and a conductor plate. The semiconductor element has an electrode on a surface. The conductor plate faces the surface of the semiconductor element and is electrically connected to the electrode of the semiconductor element.

SUMMARY

The present disclosure provides a semiconductor device that includes a semiconductor element having a surface on which a first electrode and a second electrode are disposed, a conductor plate having a surface facing the surface of the semiconductor element and electrically connected to the first electrode, an insulating layer disposed on the surface of the conductor plate and covers a part of the surface of the conductor plate, and a conductor circuit pattern disposed on the insulating layer. The conductor circuit pattern has at least one conductor line electrically connected to the semiconductor element. The at least one conductor line includes a conductor line electrically connected to the second electrode.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
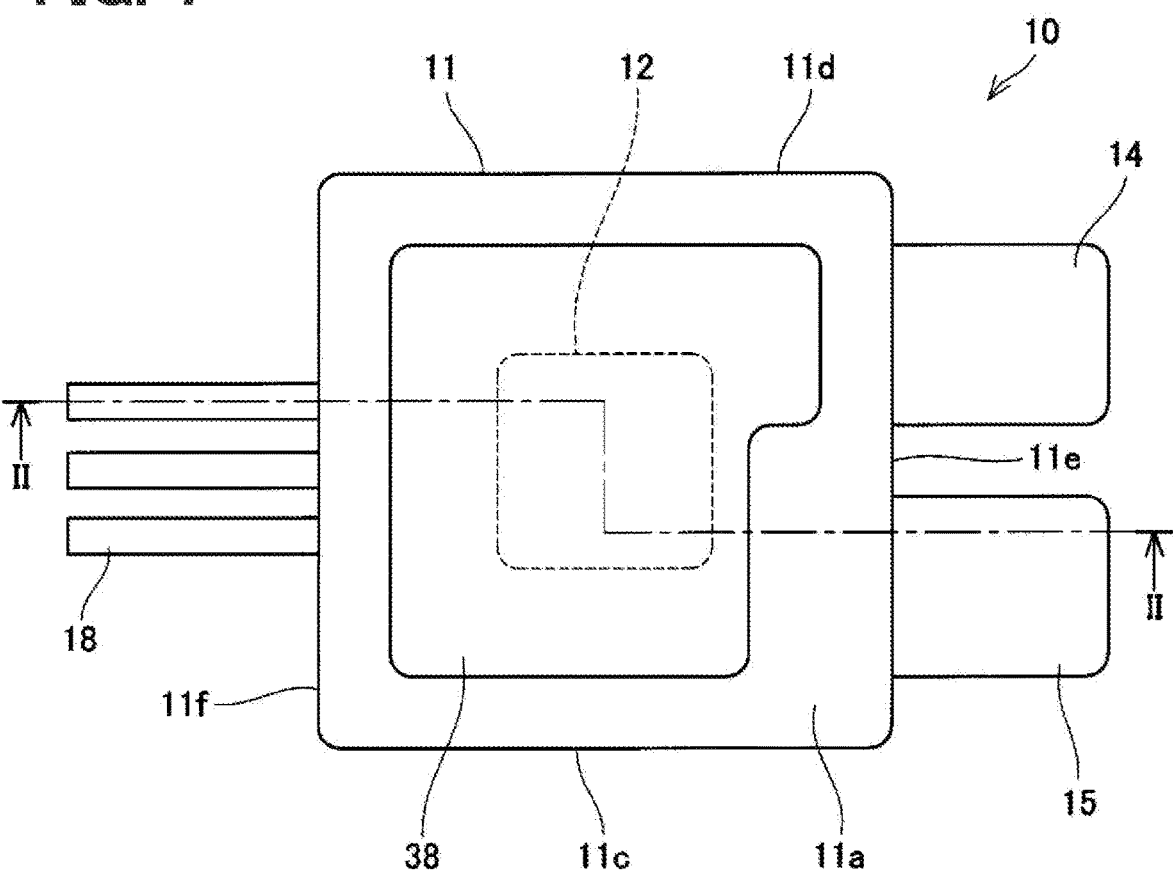
FIG. 1 is a plan view showing a semiconductor device according to a first embodiment.

A semiconductor device according to a related art includes a semiconductor element having a first electrode and a second electrode disposed on one surface, and a conductor plate electrically connected to the first electrode of the semiconductor element and facing the one surface of the semiconductor element. The second electrode of the semiconductor element is connected with a metal wire.

In the semiconductor device described above, the first electrode and the second electrode are disposed on the same surface of the semiconductor element, and two different conductor members are connected to the first electrode and the second electrode, respectively. In such a structure, it is necessary to ensure electrical insulation between the two conductor members. Therefore, the semiconductor device may become large in size.

A semiconductor device according to an aspect of the present disclosure includes a semiconductor element, a conductor plate, an insulating layer, and a conductor circuit pattern. The semiconductor element has a first surface on which a first electrode and a second electrode are disposed, and a second surface opposite to the first surface. The conductor plate has a first surface facing the first surface of the semiconductor element and electrically connected to the first electrode of the semiconductor element, and a second surface opposite to the first surface of the conductor plate. The insulating layer is disposed on the first surface of the conductor plate and covers a part of the first surface of the conductor plate. The conductor circuit pattern is disposed on the insulating layer. The conductor circuit pattern has at least one conductor line electrically connected to the semiconductor element. The at least one conductor line includes a conductor line electrically connected to the second electrode.

In the semiconductor device according to the above aspect, the conductor circuit pattern is disposed to the first surface of the conductor plate via the insulating layer. The first electrode of the semiconductor element is electrically connected to the first surface of the conductor plate, and the second electrode of the semiconductor element is electrically connected to the conductor line of the conductor circuit pattern. According to such a configuration, the conductor plate electrically connected to the first electrode and the conductor line electrically connected to the second electrode are insulated by the insulating layer interposed between the conductor plate and the conductor line. As a result, unintended contact between the conductor plate and the conductor line can be restricted, so that it is not necessary to provide a large distance between the conductor plate and the conductor line, and unnecessary increase in size of the semiconductor device can be restricted.

First Embodiment

A semiconductor device 10 according to a first embodiment will now be described with reference to FIGS. 1 to 7. The semiconductor device 10 is adopted in, for example, a power control device for an electric vehicle, and can form a part of a power conversion circuit such as a converter or an inverter. The electric vehicle herein broadly means a vehicle having a motor for driving wheels, and for example, an electric vehicle charged by an external electric power, a hybrid vehicle having an engine in addition to the motor, a fuel cell vehicle having a fuel cell as the power source and the like.

As shown in FIGS. 1 to 7, the semiconductor device 10 includes a first semiconductor element 12 and a sealing body 11. The sealing body 11 is made of an insulating material. As an example, the sealing body 11 can be formed by using, for example, an epoxy resin. The sealing body 11 has a substantially plate shape. The sealing body 11 has an upper surface 11a and a lower surface 11b opposite to the upper surface 11a. The sealing body 11 further has a first side surface 11c, a second side surface 11d, a first end surface 11e, and a second end surface 11f, and these four surfaces extend between the upper surface 11a and the lower surface 11b. The first side surface 11c and the second side surface 11d are located opposite to each other, and the first end surface 11e and the second end surface 11f are located opposite to each other.

The semiconductor device 10 includes multiple connection terminals 14, 15 and 18 whose second end portions protrude from the sealing body 11. A first end portion of each of the connection terminals 14, 15 and 18 is electrically connected to the first semiconductor element 12 inside the sealing body 11. The connection terminals 14, 15, 18 include a first power terminal 14, a second power terminal 15, and multiple first signal terminals 18. The first power terminal 14 and the second power terminal 15 protrude from the first end surface 11e of the sealing body 11, and each of the first signal terminals 18 protrudes from the second end surface 11f of the sealing body 11. The first power terminal 14 can be connected to a positive electrode of an external direct current (DC) power supply, and the second power terminal 15 can be connected to a negative electrode of the external DC power supply. The first signal terminals 18 are connected to an external device such as a control board for controlling the first semiconductor element 12, for example. The connection terminals 14, 15 and 18 are formed by using a conductive material such as copper or another metal material.

Figure 2:
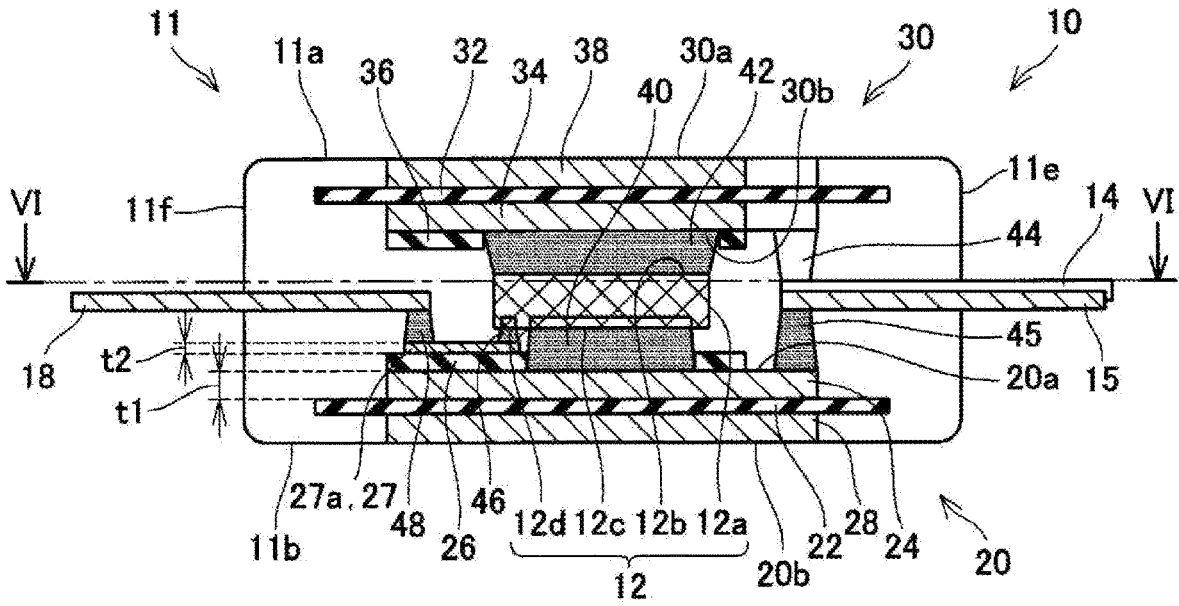
FIG. 2 is a cross-sectional view of the semiconductor device taken along line II-II in FIG. 1.
Figure 5:
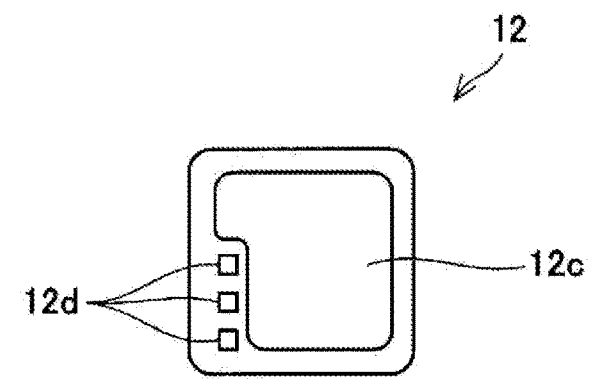
FIG. 5 is a plan view of a lower surface of a first semiconductor element.

As shown in FIGS. 2 and 5, the first semiconductor element 12 is a power semiconductor element and has a semiconductor substrate 12a and multiple electrodes 12b, 12c, and 12d. The electrodes 12b, 12c, 12d include a collector electrode 12b and an emitter electrode 12c connected to a power circuit, and multiple signal electrodes 12d connected to a signal circuit. The first semiconductor element 12 is a switching element, and can conduct and interrupt between the collector electrode 12b and the emitter electrode 12c. Although not particularly limited, the first semiconductor element 12 is a power semiconductor element having a vertical structure, the collector electrode 12b is located on an upper surface side of the semiconductor substrate 12a, and the emitter electrode 12c and the signal electrodes 12d are located on a lower surface side of the semiconductor substrate 12a. Here, the first semiconductor element 12 is an example of a semiconductor element in the technique disclosed in the present specification, the emitter electrode 12c and the signal electrode 12d are examples of a first electrode and a second electrode, respectively, in the technique disclosed in the present specification, and the collector electrode 12b is an example of a third electrode in the technique disclosed in the present disclosure.

Figure 7:
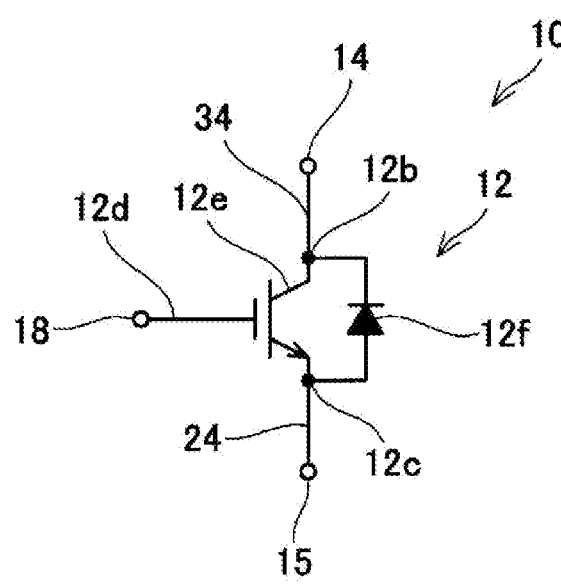
FIG. 7 is an electronic circuit diagram showing a configuration of the semiconductor device.

Although not particularly limited, as shown in FIG. 7, the first semiconductor element 12 in the present embodiment is a reverse conducting-insulated gate bipolar transistor (RC-IGBT). Therefore, the first semiconductor element 12 has an IGBT structure 12e and a diode structure 12f connected in parallel with the IGBT structure 12e. The collector electrode 12b is connected to a collector of the IGBT structure 12e, the emitter electrode 12c is connected to an emitter of the IGBT structure 12e, and the signal electrode 12d is connected to a gate of the IGBT structure 12e. The collector electrode 12b is connected to a cathode of the diode structure 12f, and the emitter electrode 12c is connected to an anode of the diode structure 12f. As another example, the semiconductor element 12 may have a metal-oxide-semiconductor field-effect transistor (MOSFET) structure. In this case, the first semiconductor element 12 may have a drain electrode and a source electrode instead of the collector electrode 12b and the emitter electrode 12c, the drain electrode may be connected to a drain of the MOSFET structure, and the source electrode may be connected to a source of the MOSFET structure. In this case, the signal electrode 12d may be connected to a gate of the MOSFET structure.

The specific configuration of the first semiconductor element 12 is not particularly limited, and various semiconductor elements can be adopted for the first semiconductor element 12. The material constituting the semiconductor substrate 12a of the first semiconductor element 12 is not particularly limited, and various semiconductor materials such as silicon (Si), silicon carbide (SiC), and gallium nitride (GaN) can be adopted.

As shown in FIG. 2, the semiconductor device 10 includes a first insulating circuit board 20 and a second insulating circuit board 30. The two insulating circuit boards 20 and 30 face each other with the first semiconductor element 12 interposed therebetween. The first insulating circuit board 20 has an upper surface 20a located inside the sealing body 11 and a lower surface 20b located opposite to the upper surface 20a. The upper surface 20a of the first insulating circuit board 20 faces the lower surface of the first semiconductor element 12, and is bonded to the emitter electrode 12c of the first semiconductor element 12 via a solder layer 40. The second insulating circuit board 30 has a lower surface 30b located inside the sealing body 11 and an upper surface 30a located opposite to the lower surface 30b. The lower surface 30b of the second insulating circuit board 30 faces the upper surface of the first semiconductor element 12, and is bonded to the collector electrode 12b of the first semiconductor element 12 via a solder layer 42. Accordingly, the first insulating circuit board 20 and the second insulating circuit board 30 are electrically and thermally connected to the first semiconductor element 12 inside the sealing body 11, and form a part of the power circuit.

The first insulating circuit board 20 has a first ceramic substrate 22. The first ceramic substrate 22 is a plate-shaped member of an insulator made of ceramic. A first inner conductor plate 24 is disposed on an upper surface of the first ceramic substrate 22, and a first outer conductor plate 28 is disposed on a lower surface of the first ceramic substrate 22. Each of the first inner conductor plate 24 and the first outer conductor plate 28 is made of a conductor material. The first inner conductor plate 24 and the first outer conductor plate 28 are electrically insulated by the ceramic substrate 22. The first inner conductor plate 24 is bonded to the emitter electrode 12c of the first semiconductor element 12 via the solder layer 40. Accordingly, the first inner conductor plate 24 of the first insulating circuit board 20 is electrically connected to the emitter electrode 12c of the first semiconductor element 12.

The second insulating circuit board 30 has a second ceramic substrate 32. The second ceramic substrate 32 is a plate-shaped member of an insulator made of ceramic. A second outer conductor plate 38 is disposed on an upper surface of the second ceramic substrate 32, and a second inner conductor plate 34 is disposed on a lower surface of the second ceramic substrate 32. Each of the second inner conductor plate 34 and the second outer conductor plate 38 is made of a conductor material. The second inner conductor plate 34 and the second outer conductor plate 38 are electrically insulated by the second ceramic substrate 32. The second inner conductor plate 34 is bonded to the collector electrode 12b of the first semiconductor element 12 via the solder layer 42. Accordingly, the second inner conductor plate 34 of the second insulating circuit board 30 is electrically connected to the collector electrode 12b of the first semiconductor element 12.

The upper surface 30a of the second insulating circuit board 30 (that is, the second outer conductor plate 38) is exposed on the upper surface 11a of the sealing body 11, and the lower surface 20b of the first insulating circuit board 20 (that is, the first outer conductor plate 28) is exposed on the lower surface 11b of the sealing body 11. Accordingly, the two insulating circuit boards 20 and 30 also function as heat sinks that dissipate heat generated by the first semiconductor element 12 on both surfaces 11a and 11b of the sealing body 11.

Figure 3:
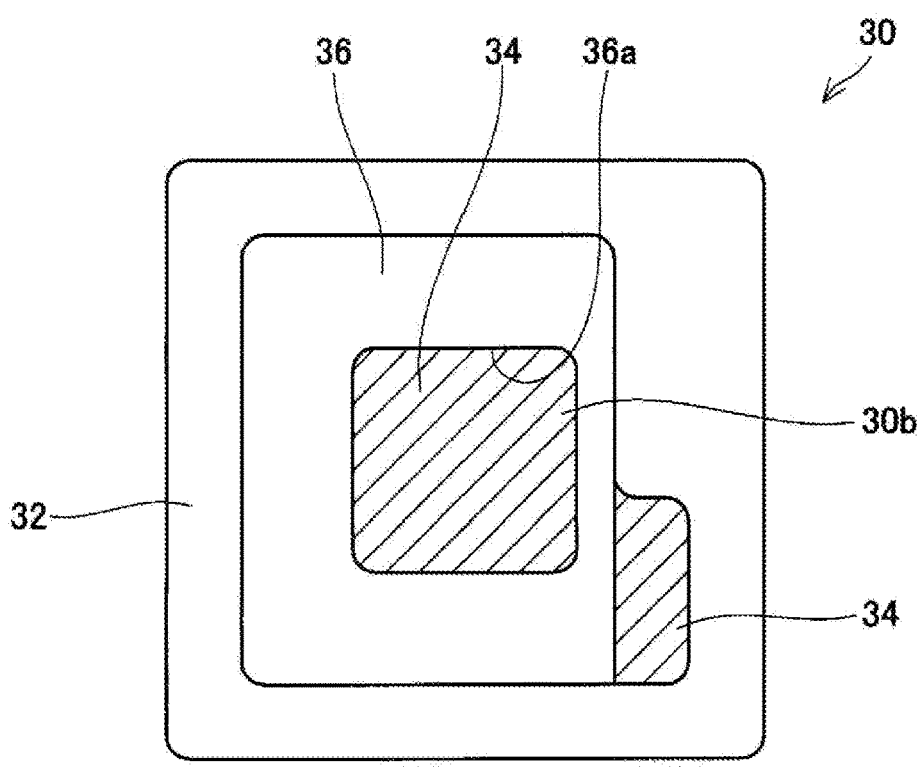
FIG. 3 is a plan view of a lower surface of a second insulating circuit board.

As shown in FIG. 2 and FIG. 3, a second insulating layer 36 is disposed on the second inner conductor plate 34 of the second insulating circuit board 30. The second insulating layer 36 covers a part of the second inner conductor plate 34. As an example, the second insulating layer 36 has an opening 36a that exposes the second inner conductor plate 34. Therefore, the collector electrode 12b of the first semiconductor element 12 is bonded to the second inner conductor plate 34 via the solder layer 42 through the opening 36a of the second insulating layer 36. The first end of the first power terminal 14 is bonded to the second inner conductor plate 34 via a solder layer 44. Although not particularly limited, the second insulating layer 36 may be disposed on the second inner conductor plate 34 in a portion other than the bonding region.

Figure 4:
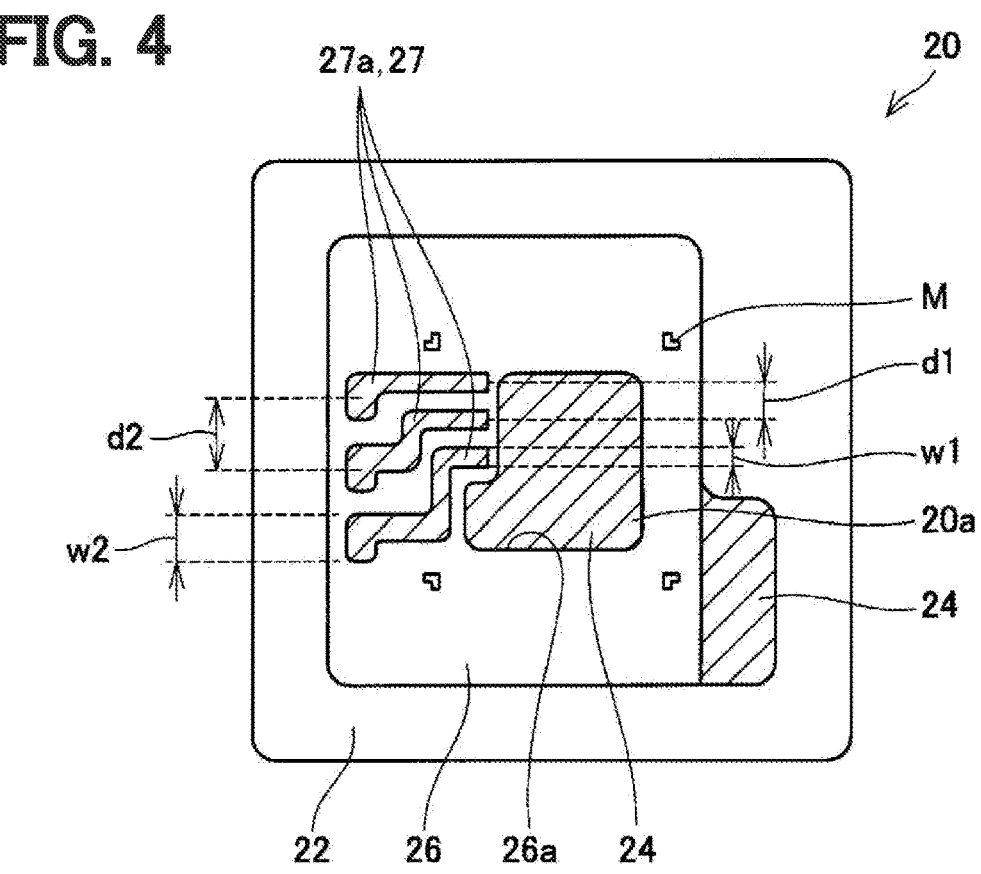
FIG. 4 is a plan view of an upper surface of a first insulating circuit board.
Figure 6:
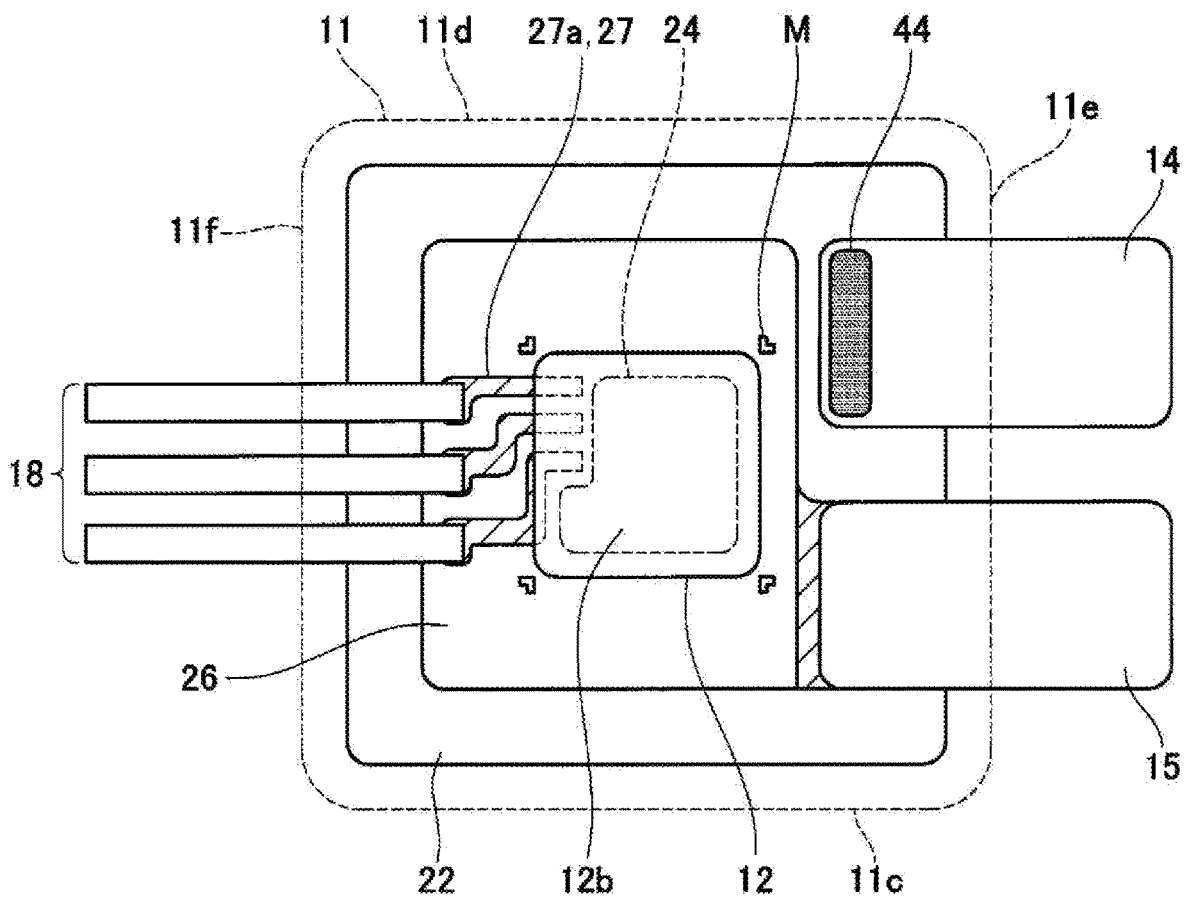
FIG. 6 is a cross-sectional view of the semiconductor device taken along line VI-VI in FIG. 2 and shows a sealing body by a dashed line.

As shown in FIG. 2, FIG. 4 and FIG. 6, a first insulating layer 26 is disposed on the first inner conductor plate 24 of the first insulating circuit board 20. The first insulating layer 26 covers a part of the first inner conductor plate 24. As an example, the first insulating layer 26 has an opening 26a that exposes the first inner conductor plate 24. The emitter electrode 12c of the first semiconductor element 12 is bonded to the first inner conductor plate 24 via the solder layer 40 through the opening 26a of the first insulating layer 26. The first end of the second power terminal 15 is bonded to the first inner conductor plate 24 via a solder layer 45. Although not particularly limited, the first insulating layer 26 may be disposed on the first inner conductor plate 24 in a portion other than the bonding region. Each of the first insulating layer 26 and the second insulating layer 36 described above is made of a material having an insulating property, and is made of a resin material such as polyimide.

The first insulating circuit board 20 further has a first conductor circuit pattern 27. The first conductor circuit pattern 27 is disposed on the first insulating layer 26. Although not particularly limited, the first conductor circuit pattern 27 is located inside the sealing body 11. The first conductor circuit pattern 27 includes multiple first conductor lines 27a. The first conductor lines 27a are electrically connected to the first semiconductor element 12. Each of the first conductor line 27a has a first end portion close to the first semiconductor element 12 and a second end portion away from the first semiconductor element 12. The first end portions of the first conductor lines 27a are bonded to the signal electrode 12d of the first semiconductor element 12 via a solder layer 46. The second end portions of the first conductor lines 27a are bonded to the first end portions of the first signal terminals 18 via a solder layer 48. Therefore, each of the first signal terminals 18 is electrically connected to the signal electrode 12d of the first semiconductor element 12 via the corresponding one of the first conductor lines 27a.

Although not particularly limited, as shown in FIG. 2, a thickness t2 of the first conductor circuit pattern 27 is smaller than a thickness t1 of the first inner conductor plate 24 of the first insulating circuit board 20. The first conductor circuit pattern 27 is made of a conductor material such as copper or other metallic material. Bonding members between the signal electrodes 12d and the first conductor lines 27a, and between the first conductor lines 27a and the first signal terminals 18 are not limited to the solder layers 46 and 48, and may be other bonding layers having conductivity.

As shown in FIG. 4 and FIG. 6, on the first insulating layer 26 of the first insulating circuit board 20, marks M are provided at positions corresponding to a peripheral edge of the first semiconductor element 12 for positioning of the first semiconductor element 12. According to such a configuration, the first semiconductor element 12 can be accurately positioned on the first inner conductor plate 24 at the time of manufacturing the semiconductor device 10. The specific configuration of the marks M is not particularly limited, but the marks M may be configured to be identifiable by, for example, image processing.

As an example, each of the first insulating circuit board 20 and the second insulating circuit board 30 is a direct bonded copper (DBC) board. However, each of the first insulating circuit board 20 and the second insulating circuit board 30 is not limited to the DBC substrate, and may be a direct bonded aluminum (DBA) substrate or an active metal brazing (AMB) substrate. Each of the ceramic substrates 22 and 32 is an insulator member made of ceramic as described above. Each of the ceramic substrates 22 and 32 is made of a ceramic material such as aluminum oxide, silicon nitride, or aluminum nitride. Each of the ceramic substrates 22 and 32 is an example of an insulator substrate in the technique disclosed in the present specification. The insulating substrate is not limited to the ceramic material, and may be made of an insulating material such as a resin material.

In the above-described semiconductor device 10, the emitter electrode 12c and the signal electrodes 12d are disposed on the lower surface of the first semiconductor element 12 as shown in FIG. 5. The first inner conductor plate 24 is connected to the emitter electrode 12c, and the first conductor lines 27a are connected to the signal electrodes 12d, respectively. In such a structure in which two different conductor members are connected to the first semiconductor element 12, it is necessary to ensure electrical insulation between the two conductor members.

In view of the above issues, in the semiconductor device 10 of the present embodiment, the first conductor circuit pattern 27 is disposed to the first inner conductor plate 24 via the first insulating layer 26. The emitter electrode 12c of the first semiconductor element 12 is electrically connected to the first inner conductor plate 24, and the signal electrodes 12d of the first semiconductor element 12 are electrically connected to the first conductor lines 27a of the first conductor circuit pattern 27, respectively. According to such a configuration, the first inner conductor plate 24 electrically connected to the emitter electrode 12c and the first conductor lines 27a electrically connected to the signal electrodes 12d are insulated by the first insulating layer 26 interposed between the first inner conductor plate 24 and the first conductor lines 27a. As a result, unintended contact between the first inner conductor plate 24 and the first conductor lines 27a can be restricted, so that it is not necessary to provide a large distance between the first inner conductor plate 24 and the first conductor lines 27a, and unnecessary increase in size of the semiconductor device 10 can be restricted.

As shown in FIG. 2, in the semiconductor device 10 of the present embodiment, the thickness t2 of the first conductor circuit pattern 27 is smaller than the thickness t1 of the first inner conductor plate 24. When the thickness t2 of the first conductor circuit pattern 27 is small, it becomes easy to form the first conductor circuit pattern 27 having a fine structure by patterning processing such as etching. In particular, when the first conductor circuit pattern 27 is used as a part of the signal circuit as in the present embodiment, the voltage applied to the first conductor circuit pattern 27 is smaller than the voltage applied to the first inner conductor plate 24 which is a part of the power circuit. Therefore, the thickness t2 of the first conductor circuit pattern 27 can be made relatively small by that amount. As an example, the thickness t2 of the first conductor circuit pattern 27 may be several tens of micrometers. The signal electrodes 12d of the first semiconductor element 12 are an example of a second electrode disclosed in the present specification, and the second electrode may be, for example, a collector electrode of a power electrode. In that case, the first semiconductor element 12 may be a power semiconductor element having a lateral structure.

In the semiconductor device 10 of the present embodiment, the first insulating layer 26 has an opening 26a that exposes the upper surface 20a (that is, the first inner conductor plate 24) of the first insulating circuit board 20. The emitter electrode 12c of the first semiconductor element 12 is bonded to the upper surface 20a of the first inner conductor plate 24 via the solder layer 40 through the opening 26a of the first insulating layer 26. With such a configuration, it is possible to restrict the emitter electrode 12c from being bonded beyond an intended region on the first inner conductor plate 24. Therefore, it is possible to reduce a short circuit between the emitter electrode 12c and each of the signal electrodes 12d due to this bonding. A bonding member between the first inner conductor plate 24 and the emitter electrode 12c is not limited to the solder layer 40, and may be another bonding layer having conductivity.

The semiconductor device 10 of the present embodiment includes a second insulating layer 36 disposed on the lower surface 30b (that is, the second inner conductor plate 34) of the second insulating circuit board 30 and covering a part of the lower surface 30b. According to such a configuration, it is possible to restrict the second inner conductor plate 34 from being unintentionally short-circuited with the first inner conductor plate 24 or other members of the first insulating circuit board 20. That is, a short circuit between the collector and the emitter of the semiconductor device 10 is restricted.

As shown in FIG. 4, in the semiconductor device 10 of the present embodiment, the first conductor lines 27a have the first end portions electrically connected to the first semiconductor element 12 and the second end portions electrically connected to the first signal terminals 18, respectively. In this case, a width w2 at the second end portions of the first conductor lines 27a may be larger than a width w1 at first end portions of the first conductor lines 27a. According to such a configuration, even when a size of the first semiconductor element 12, particularly a width of the signal electrodes 12*d*, is relatively small, the first signal terminals 18 having a width larger than that of the first signal electrodes 12*d* can be easily connected to the first conductor lines 27*a*.

In the semiconductor device 10 of the present embodiment, in the two first conductor lines 27*a* extending in parallel with each other among the multiple first conductor lines 27*a*, a center distance d2 between centers at the second end portions of the two first conductor lines 27*a* is larger than a center distance d1 between centers at the first end portions of the two first conductor lines 27*a*. Even with such a configuration, the first end portions of the two first conductor lines 27*a* can be connected to the signal electrodes 12*d* of the first semiconductor element 12 having a relatively small size, and the second end portions of the two first conductor lines 27*a* can be connected to the first signal terminals 18 having a width larger than that of the signal electrodes 12*d*.

The semiconductor device 10 of the present embodiment can be modified in various ways. Examples of modifications will be described with reference to FIGS. 8 to 11.

(First Modification)

Figure 8:
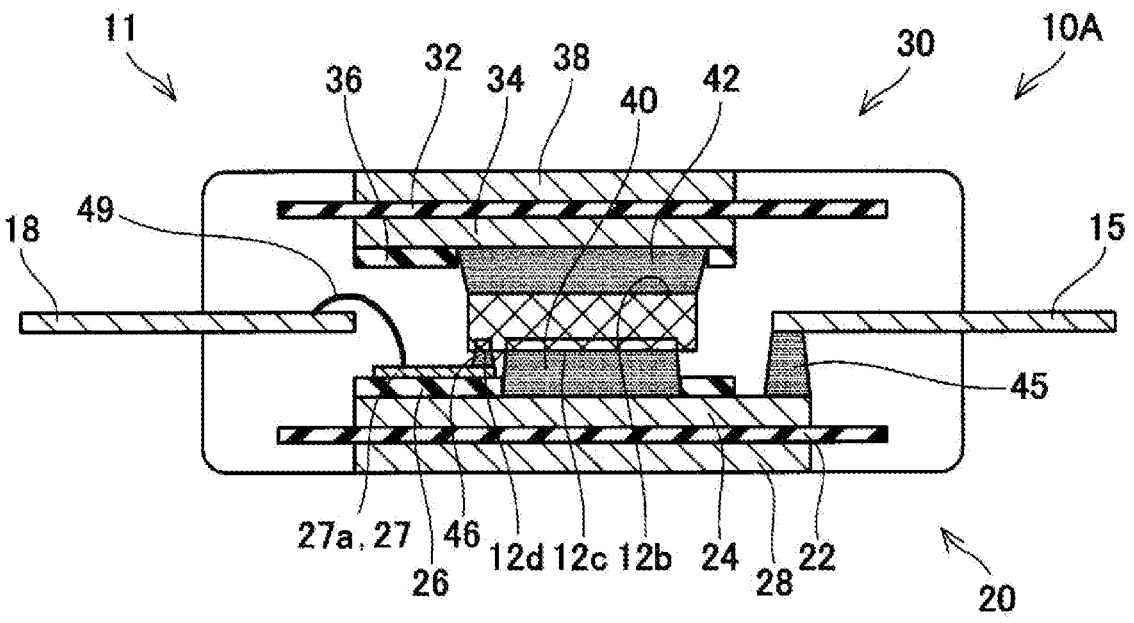
FIG. 8 is a cross-sectional view showing an internal structure of a semiconductor device according to a first modification.

A semiconductor device 10A of a first modification will be described with reference to FIG. 8. As shown in FIG. 8, in the semiconductor device 10A of the first modification, the first signal terminals 18 are connected to the first conductor lines 27*a* via wires 49 instead of the solder layer 48 in the first embodiment. In the semiconductor device 10A of the first modification, parts other than the wires 49 can be configured in the same manner as the semiconductor device 10 of the first embodiment. In the first modification, the same components as those in the first embodiment are indicated by the same reference numbers, and duplicate description will be omitted.

The wires 49 connect the first signal terminals 18 and the first conductor lines 27*a*, and are made of a metal material such as copper. The connecting members connecting the first signal terminals 18 and the first conductor lines 27*a* are not limited to the wires 49, and may be, for example, connecting members having flexibility and conductivity. By using the wires 49 having flexibility, for example, it is possible to allow a relative displacement between the first signal terminals 18 and the first conductor lines 27*a* due to thermal deformation. Not only the first signal terminals 18 and the first conductor lines 27*a* but also the first conductor lines 27*a* and the signal electrodes 12*d* may be connected via, for example, wires.

(Second Modification)

Figure 9:
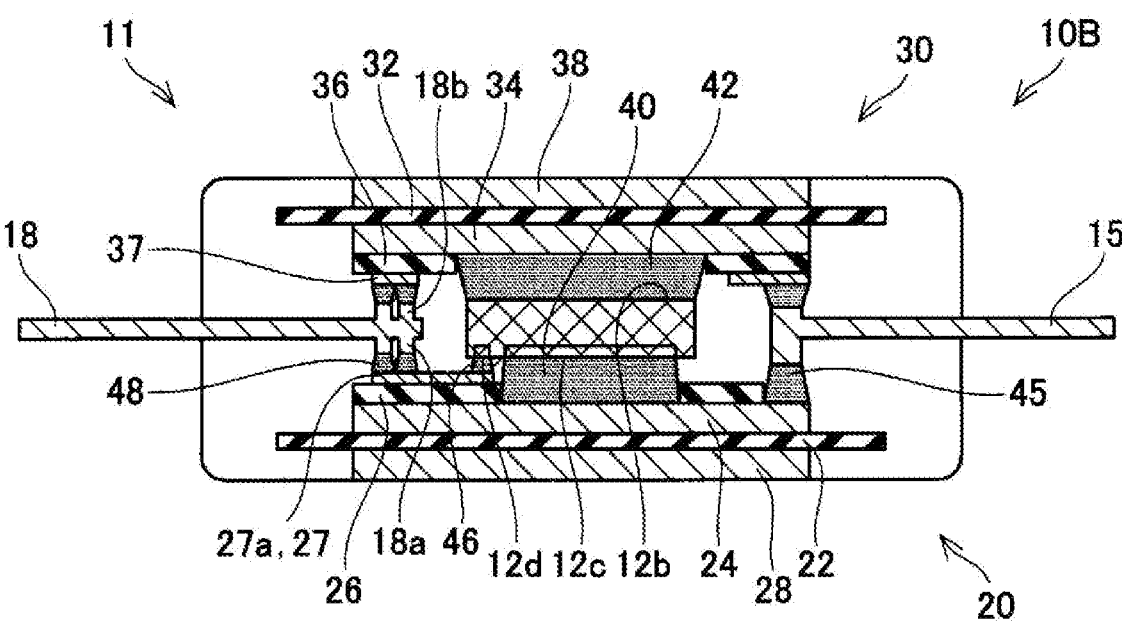
FIG. 9 is a cross-sectional view showing an internal structure of a semiconductor device according to a second modification.

A semiconductor device 10B of a second modification will be described with reference to FIG. 9. As shown in FIG. 9, the semiconductor device 10B of the second modification includes a conductor film 37 in addition to the configuration of the semiconductor device 10 of the first embodiment. Further, the shapes of the first signal terminals 18 and the second power terminal 15 in the first embodiment are partially changed. In the semiconductor device 10B of the second modification, parts other than these parts can be configured in the same manner as the semiconductor device 10 of the first embodiment. In the second modification, the same components as those in the first embodiment are indicated by the same reference numbers, and duplicate description will be omitted.

The conductor film 37 is disposed on the second insulating layer 36 of the second insulating circuit board 30. The conductor film 37 is made of a conductor material such as copper or other metal material. One end portion of each of the first signal terminals 18 in the second modification has multiple first convex portions 18*a* protruding toward the first conductor line 27*a*. The first signal terminals 18 are bonded to the second end portions of the first conductor lines 27*a* at the first convex portions 18*a* via the solder layer 48. Accordingly, when the first signal terminals 18 and the first conductor lines 27*a* are bonded, a wet spread of a solder is restricted by edge portions of the first convex portions 18*a*. Therefore, it is possible to restrict the solder from coming into contact with an unintended position other than the bonding region.

In addition, the one end portion of each of the first signal terminals 18 has multiple second convex portions 18*b* protruding toward the conductor film 37 at positions opposite to the first convex portions 18*a*. The first signal terminals 18 are bonded to the conductor film 37 at each of the second convex portions 18*b* via a solder layer. According to such a configuration, the first signal terminals 18 are fixed to the first insulating circuit board 20 via the first convex portions 18*a*, and are fixed to the second insulating circuit board 30 via the second convex portions 18*b*. Therefore, changes in the relative positions and postures of the first signal terminal 18 with respect to the first insulating circuit board 20 and the second insulating circuit board 30 can be restricted.

In a manner similar to the first signal terminal 18, one end portion of the second power terminal 15 has a third convex portion 15*a* protruding toward the first inner conductor plate 24, a fourth convex portion 15*b* protruding toward the conductor film 37 at a position opposite to the third convex portion 15*a*. The second power terminal 15 is bonded to the first inner conductor plate 24 at the third convex portion 15*a* via the solder layer 45, and is bonded to the conductor film 37 at the fourth convex portion 15*b* via the solder layer. Accordingly, in the semiconductor device 10B, the first insulating circuit board 20 and the second insulating circuit board 30 are fixed through the convex portions 18*a*, 18*b*, 15*a*, and 15*b* at both of the first signal terminals 18 and the second power terminal 15. At the same time, the first insulating circuit board 20 and the second insulating circuit board 30 can be stably supported in the semiconductor device 10B. Therefore, even when the semiconductor device 10B is assembled, the positioning of the semiconductor device 10B between the insulating circuit board 20 and the second insulating circuit board 30 in the stacking direction can be accurately performed without using a jig.

The number of the convex portions 18*a*, 18*b*, 15*a*, 15*b* in the first signal terminals 18 and the second power terminal 15 is not limited to the number shown in FIG. 9. Each of the first signal terminals 18 and the second power terminal 15 may have one or more convex portions 18*a*, 18*b*, 15*a*, 15*b*. In FIG. 9, each of the convex portions 18*a*, 18*b*, 15*a*, and 15*b* is integrally formed with the first signal terminals 18 or the second power terminal 15. However, each of the convex portions 18*a*, 18*b*, 15*a*, and 15*b* may also be provided as a separate member (for example, a spacer) from the first signal terminals 18 or the second power terminal 15. In such a case, the spacer may be formed by using a material same as or different from the first signal terminal 18 or the second power terminal 15. Alternatively, for example, the second convex portion 18*b* and/or the fourth convex portion 15*b* may be formed integrally with or separately from the second insulating layer 36. In such a case, the semiconductor device 10B of the second modification does not have to include the second insulating layer 36. The convex portions 18*a*, 18*b*, 15*a*, 15*b* may be provided in all of the connection terminals 14, 15, 18 or at least one of the connection terminals 14, 15, 18.

(Third Modification)

Figure 10:
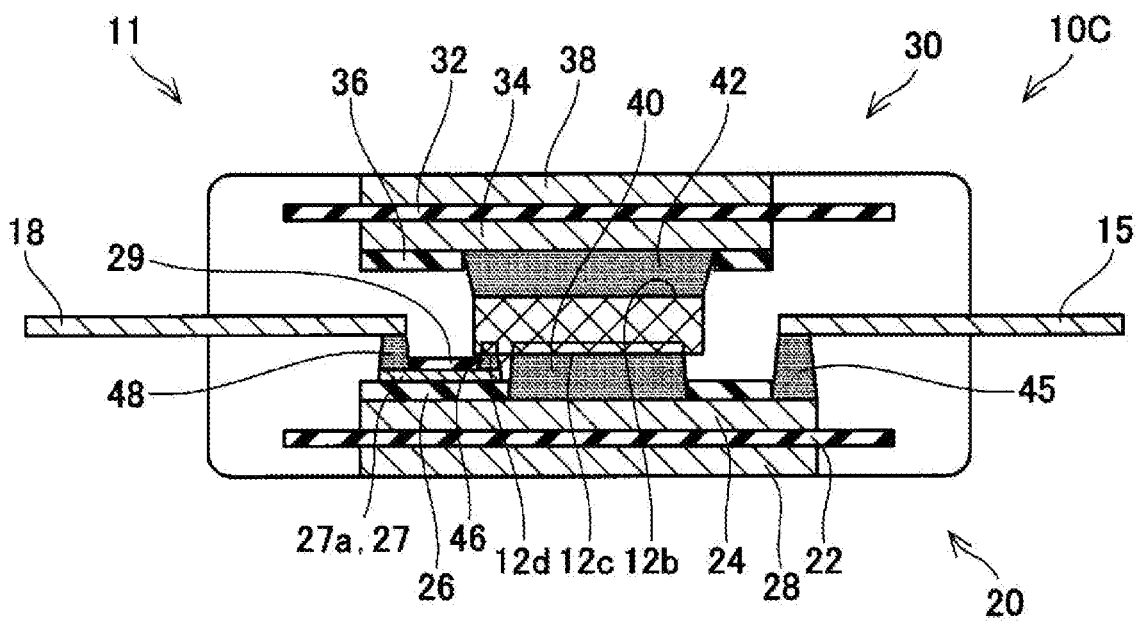
FIG. 10 is a cross-sectional view showing an internal structure of a semiconductor device according to a third modification.

A semiconductor device 100 of a third modification will be described with reference to FIG. 10. As shown in FIG. 10, the semiconductor device 100 of the third modification includes an insulating cover 29 in addition to the configuration of the semiconductor device 10 of the first embodiment. In the semiconductor device 100 of the third modification, parts other than the insulating cover 29 can be configured in the same manner as the semiconductor device 10 of the first embodiment. In the third modification, the same components as those in the first embodiment are indicated by the same reference numbers, and duplicate description will be omitted. The insulating cover 29 is disposed on the first conductor lines 27*a* of the first insulating circuit board 20. The insulating cover 29 partially covers the first conductor lines 27*a*. The insulating cover 29 is made of a material having an insulating property, and can be made of a resin material such as polyimide. With such a configuration, it is possible to restrict the first conductor lines 27*a* from being unintentionally short-circuited with another member.

(Fourth Modification)

Figure 11:
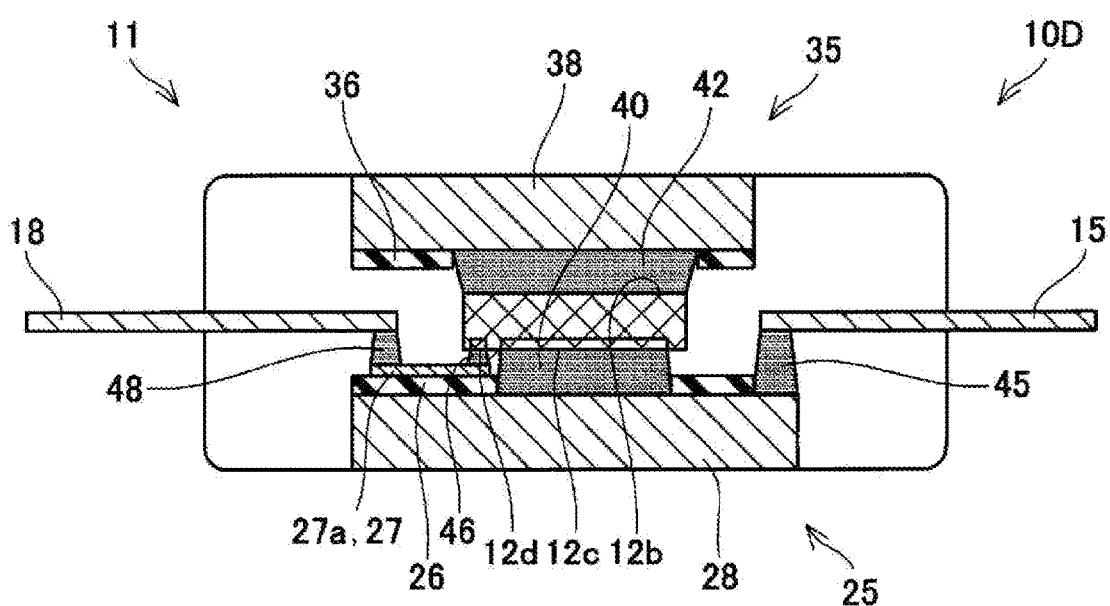
FIG. 11 is a cross-sectional view showing an internal structure of a semiconductor device according to a fourth modification.

A semiconductor device 10D of a fourth modification will be described with reference to FIG. 11. As shown in FIG. 11, the semiconductor device 10D of the fourth modification is different from the semiconductor device 10 of the first embodiment in that the semiconductor device 10D includes a first conductor plate 25 and a second conductor plate 35 instead of the first insulating circuit board 20 and the second insulating circuit board 30. The first conductor plate 25 and the second conductor plate 35 do not include the ceramic substrates 22 and 32, respectively. The first conductor plate 25 corresponds to a member in which the first inner conductor plate 24 and the first outer conductor plate 28 in the first embodiment are integrated. Similarly, the second conductor plate 35 corresponds to a member in which the second inner conductor plate 34 and the second outer conductor plate 38 in the first embodiment are integrated. Therefore, in the semiconductor device 10D of the fourth modification, parts other than a point that the ceramic substrates 22 and 32 are not provided can be configured in the same manner as the semiconductor device 10 of the first embodiment. In the fourth modification, the same components as those in the first embodiment are indicated by the same reference numbers, and duplicate description will be omitted. Even in such a configuration, the first conductor plate 25 electrically connected to the emitter electrode 12*c* and the first conductor lines 27*a* electrically connected to the signal electrodes 12*d* are insulated by the first insulating layer 26 interposed between the first conductor plate 25 and the first conductor lines 27*a*. Accordingly, an unintended contact between the first conductor plate 25 and the first conductor lines 27*a* can be restricted.

The following describes a method of manufacturing the semiconductor device 10 with reference to FIGS. 12 to 15. However, this manufacturing method is an example and is not particularly limited. The manufacturing method is roughly divided into the following three processes. The three processes include a first process of forming the first insulating layer 26 on the first inner conductor plate 24 in the first insulating circuit board 20, a second process of forming the first conductor lines 27*a* on the first insulating layer 26, and assembling components of the semiconductor device 10. Known techniques can be adopted to processes other than the processes described below.

Figure 12A:
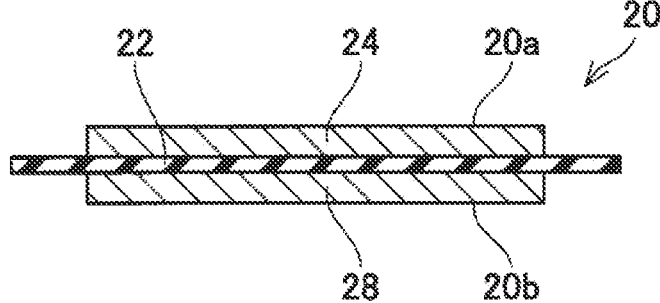
FIG. 12A is a cross-sectional view showing a process of preparing the first insulating circuit board.
Figure 12B:
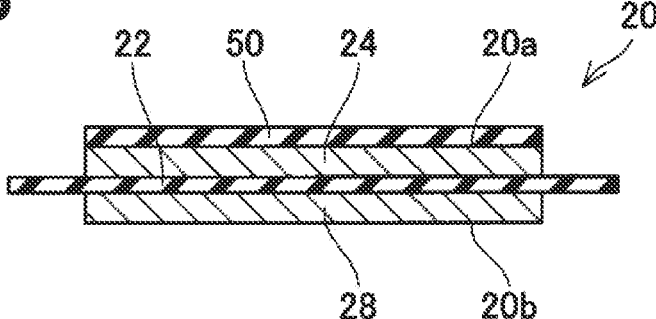
FIG. 12B is a cross-sectional view showing a process of forming a resin layer on a first inner conductor plate of the first insulating circuit board.
Figure 12C:
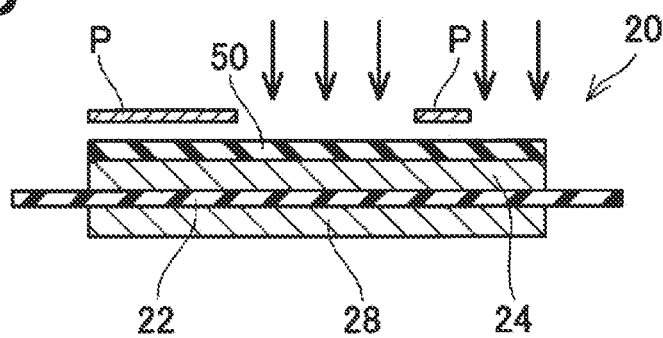
FIG. 12C is a cross-sectional view showing a process of exposing the resin layer.
Figure 12D:
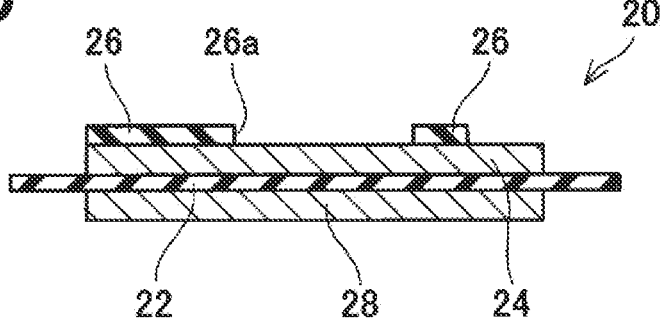
FIG. 12D is a cross-sectional view showing a process of developing the exposed resin layer.

The first process will be described with reference to FIGS. 12A to 12D. As shown in FIG. 12A, first, the first insulating circuit board 20 is prepared. Next, as shown in FIG. 12B, a resin layer 50 is formed on the upper surface 20*a* of the prepared first insulating circuit board 20 (that is, on the first inner conductor plate 24). Here, the resin layer 50 is made of a photosensitive resin material, and is formed by using a resin material such as polyimide. Next, as shown in FIG. 12C, the formed resin layer 50 is exposed to light. Specifically, a surface of the resin layer 50 is irradiated with light through a photomask P to expose a predetermined range of the resin layer 50. Next, as shown in FIG. 12D, the exposed resin layer 50 is developed. By the developing process, an unnecessary portion of the exposed resin layer 50 (a portion serving as a bonding region such as the inside of the opening 26*a* of the first insulating layer 26) is removed and washed. As a result, the first insulating layer 26 is formed on the first insulating circuit board 20.

Figure 13A:
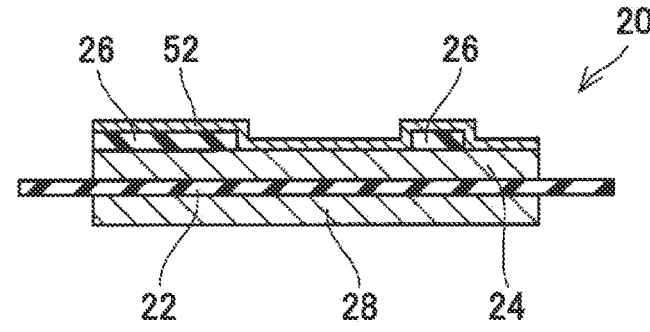
FIG. 13A is a cross-sectional view showing a process of forming a seed layer on a first insulating layer.

The second process will be described with reference to FIGS. 13A to 13E. As shown in FIG. 13A, a seed layer 52 is formed on the first insulating layer 26 formed in the first process. The seed layer 52 is formed by, for example, a sputtering method. Here, the seed layer 52 is made of a conductor material such as copper or another metal material. A thickness dimension of the seed layer 52 may be about 0.1 to 5 micrometers.

Figure 13B:
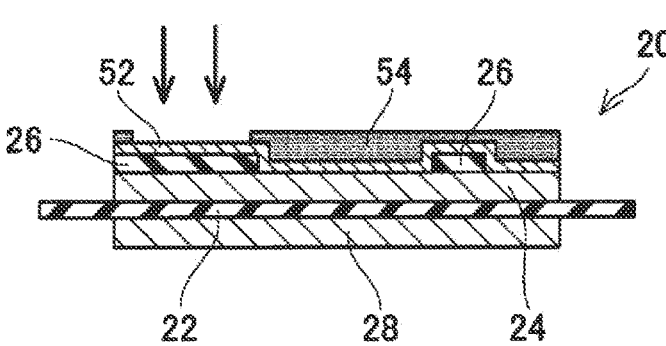
FIG. 13B is a cross-sectional view showing a process of forming a patterned resist layer on the seed layer.

As shown in FIG. 13B, a patterned resist layer 54 is formed on the seed layer 52. Specifically, after forming a resist layer, exposing and developing processes are performed to remove an exposed portion of the resist layer. As a result, the patterned resist layer 54 is formed. Therefore, the seed layer 52 is masked by the patterned resist layer 54.

Figure 13C:
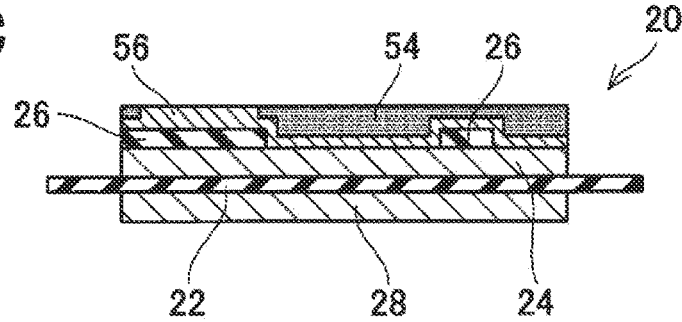
FIG. 13C is a cross-sectional view showing a process of forming a plating layer on the seed layer masked by the resist layer.
Figure 13D:
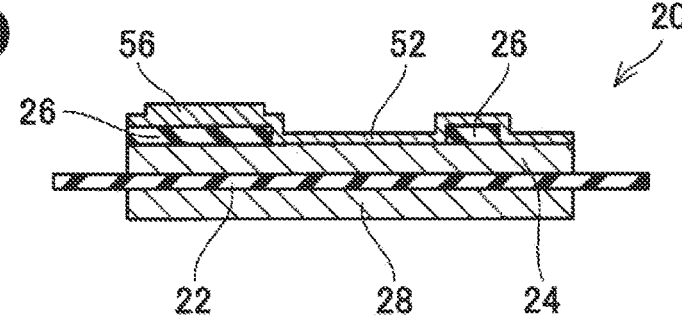
FIG. 13D is a cross-sectional view showing a process of removing the resist layer from the seed layer.
Figure 13E:
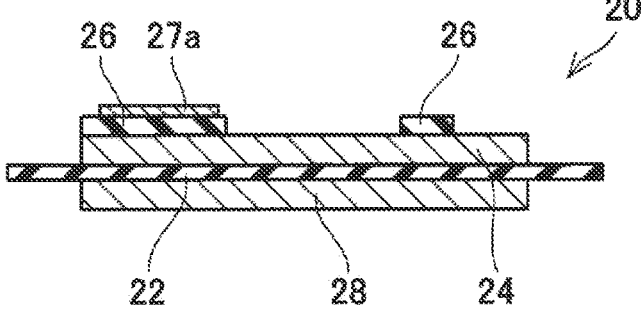
FIG. 13E is a cross-sectional view showing a process of removing the seed layer.

As shown in FIG. 13C, a plating layer 56 is formed on the seed layer 52 masked by the resist layer 54. The plating layer 56 is formed by a plating process. Then, as shown in FIG. 13D, the resist layer 54 is removed from the seed layer 52. The resist layer 54 is decomposed and removed by, for example, an ashing treatment. Next, as shown in FIG. 13E, the seed layer 52 other than the seed layer 52 formed under the plating layer 56 is removed. The seed layer 52 is removed by, for example, a dry etching method. In the first insulating circuit board 20, the first conductor lines 27*a* are formed on the first insulating layer 26 as described above.

The third process will be described with reference to FIGS. 14A and 14B. First, the second insulating circuit board 30, the first semiconductor element 12, and the connection terminals 15 and 18 are prepared. In the description here, the illustration of the first power terminal 14 is omitted. At this time, the first semiconductor element 12 and the connection terminals 15 and 18 may be prepared as one member that is integrally formed (for example, a lead frame). The second insulating circuit board 30 can be formed with reference to the first process of the first insulating circuit board 20, and the description of the method of forming the second insulating circuit board 30 is omitted.

Figure 14A:
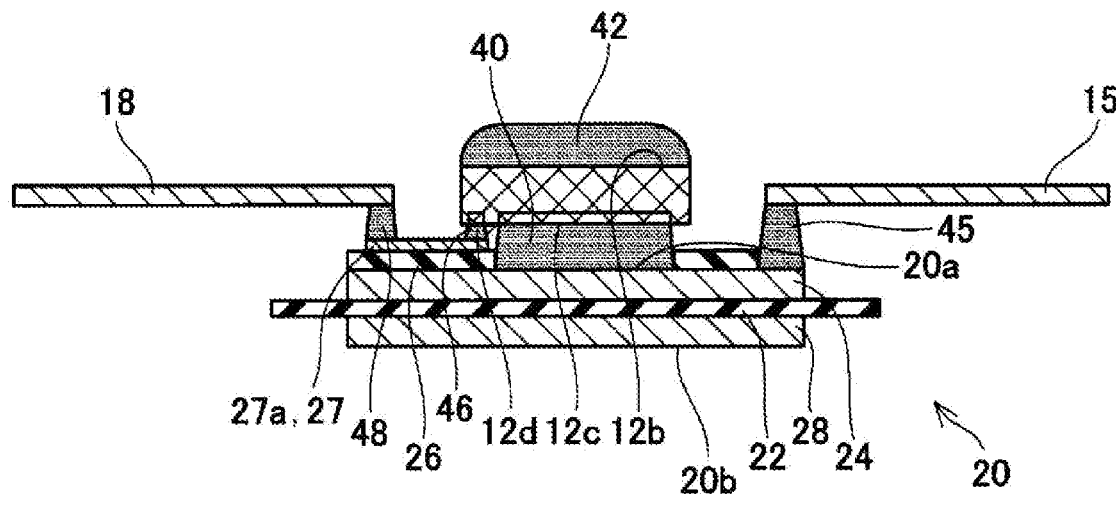
FIG. 14A is a cross-sectional view showing a first reflow process.
Figure 14B:
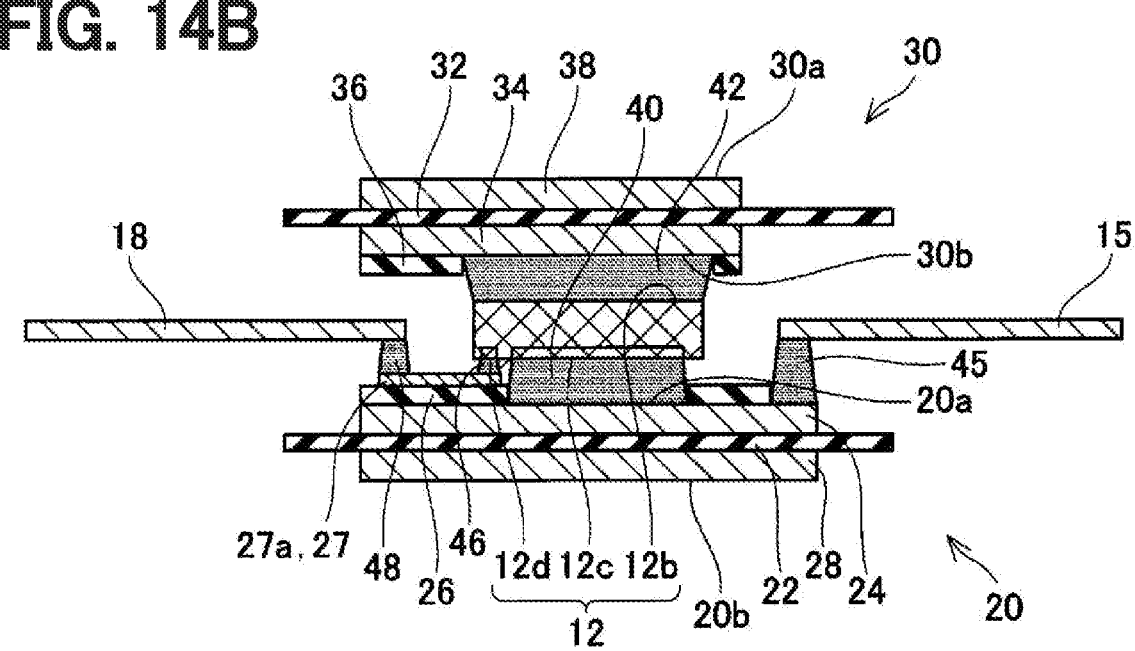
FIG. 14B is a cross-sectional view showing a second reflow process.

Then, as shown in FIG. 14A, a first reflow process is performed. In the first reflow process, the first semiconductor element 12 and the connection terminals 15 and 18 are soldered to predetermined positions on the upper surface 20*a* of the first insulating circuit board 20 provided with the first conductor lines 27*a* in the second process. Specifically, the emitter electrode 12*c* of the first semiconductor element 12 is bonded to the first inner conductor plate 24 of the first insulating circuit board 20 via the solder layer 40, and the first signal electrodes 12*d* of the first semiconductor element 12 are respectively bonded to the first end portions of the first conductor lines 27*a* of the first insulating circuit board 20 via the solder layer 46. Further, the one end portions of the first signal terminal 18 are respectively bonded to the second end portions of the first conductor lines 27a via the solder layer 48, and the second power terminal 15 is bonded to the first inner conductor plate 24 via the solder layer 45. At the time of soldering, it is preferable to also arrange a preliminary solder on the upper surface of the first semiconductor element 12. Then, as shown in FIG. 14B, the second reflow process is performed. In the second reflow process, the second insulating circuit board 30 is soldered to the lower surface of the first semiconductor element 12. Specifically, the second inner conductor plate 34 of the second insulating circuit board 30 is bonded to the collector electrode 12b of the first semiconductor element 12 via the solder layer 42.

The semiconductor device 10 can be manufactured by the above manufacturing method. However, the manufacturing method of the semiconductor device 10 is not limited to the above-described method. The second process of the semiconductor device 10 illustrated in FIGS. 13A to 13E may be replaced with another method. Another manufacturing method will be described below with reference to FIGS. 15A to 15C.

Figure 15A:
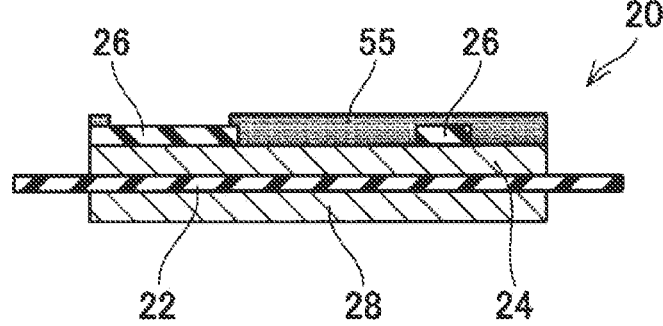
FIG. 15A is a cross-sectional view showing a process of forming a patterned resist layer on the first insulating layer.

As shown in FIG. 15A, a patterned resist layer 55 is formed on the first insulating layer 26 formed in the first process. Specifically, after forming a resist layer, exposing and developing processes are performed to remove an exposed portion of the resist layer. As a result, the patterned resist layer 55 is formed. Therefore, the first insulating layer 26 is masked by the patterned resist layer 55.

Figure 15B:
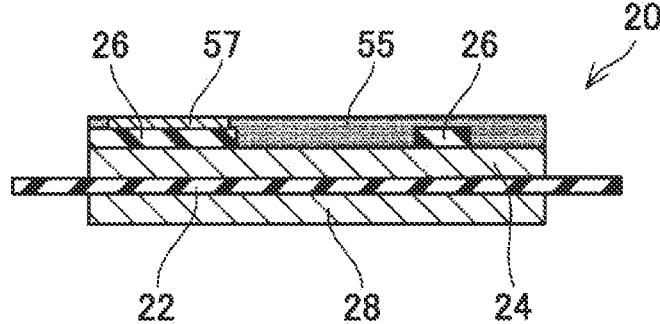
FIG. 15B is a cross-sectional view showing a process of forming a plating layer on the first insulating layer masked by the resist layer.
Figure 15C:
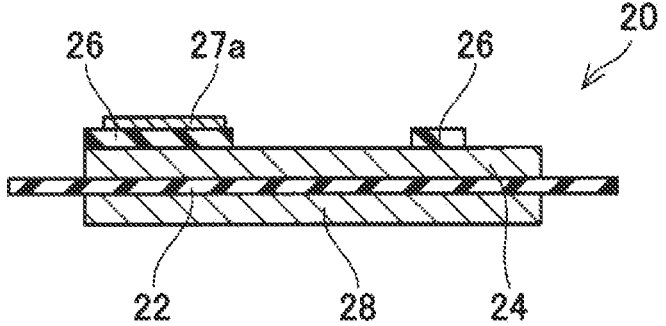
FIG. 15C is a cross-sectional view showing a process of removing the resist layer from the first insulating layer.

As shown in FIG. 15B, a plating layer 57 is formed on the first insulating layer 26 masked by the resist layer 55. The plating layer 56 is formed by a plating process. Next, as shown in FIG. 15C, the resist layer 55 is removed from the first insulating layer 26. The resist layer 55 is decomposed and removed by, for example, an ashing treatment. In the ashing treatment, it is required to sufficiently remove the resist layer 55 while leaving the first insulating layer 26. Therefore, as an ashing solution used for the ashing treatment, it is preferable to select a solution that reacts well with the material constituting the resist layer 55 and does not react, is difficult to react, or reacts relatively slowly with the material constituting the first insulating layer 26.

The manufacturing method of the semiconductor device 10 described above can be applied to fifth and sixth modification described later in addition to the first to fourth modification described above.

(Fifth Modification)

Figure 16:
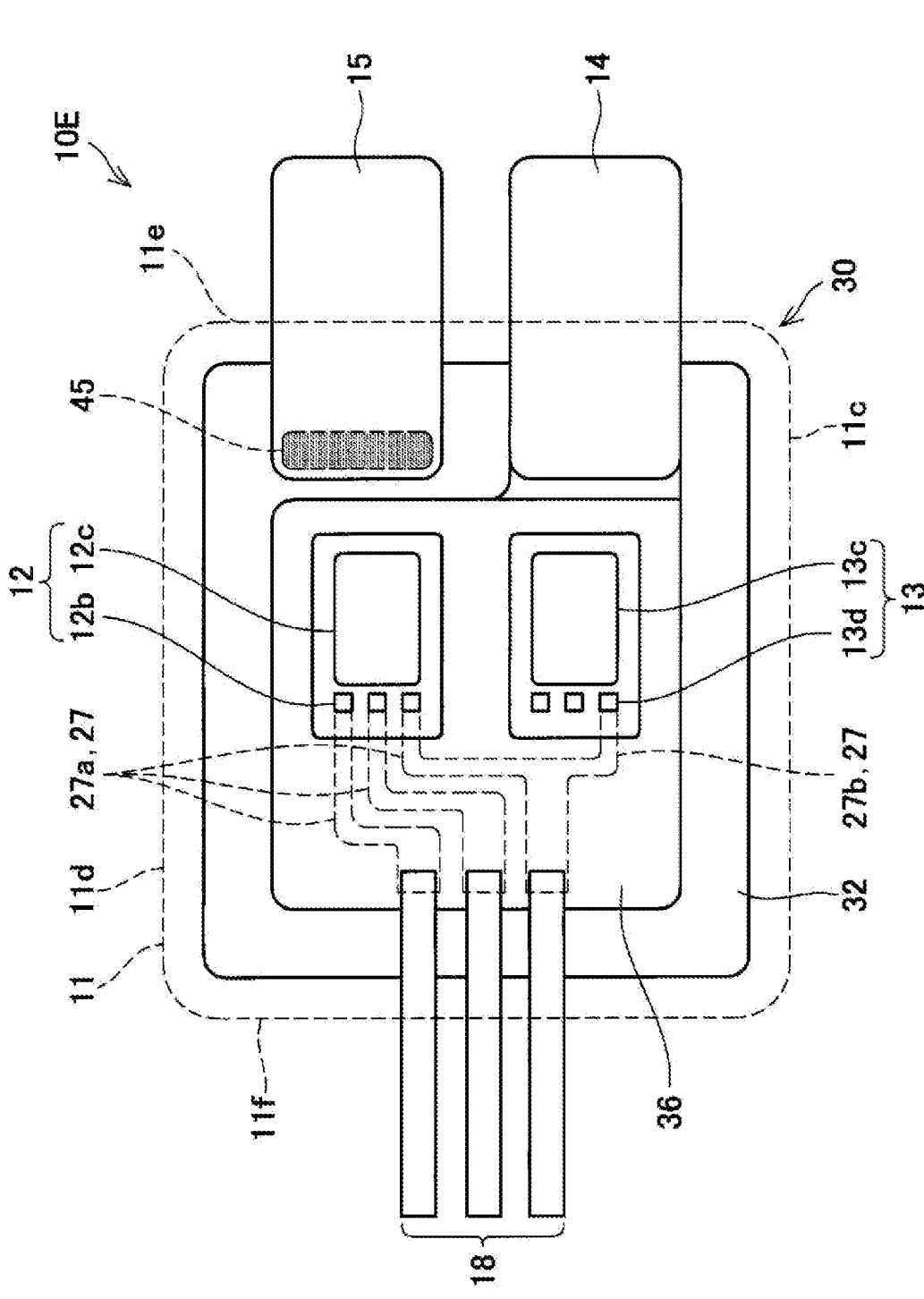
FIG. 16 is a cross-sectional view showing an internal structure of a semiconductor device according to a fifth modification taken along a direction perpendicular to a thickness direction of the semiconductor device.

A semiconductor device 10E of a fifth modification will be described with reference to FIG. 16. As shown in FIG. 16, the semiconductor device 10E of the fifth modification further includes a second semiconductor element 13 in addition to the configuration of the semiconductor device 10 of the first embodiment. Along with this change, the configuration of the first conductor circuit pattern 27 of the first insulating circuit board 20 is partially changed, and the first conductor circuit pattern 27 further has a second conductor line 27b. In the semiconductor device 10E of the fifth modification, parts other than the second semiconductor element 13 and the second conductor line 27b can be configured in the same manner as the semiconductor device 10 of the first embodiment. In the fifth modification, the same components as those in the first embodiment are indicated by the same reference numbers, and duplicate description will be omitted.

The second semiconductor element 13 is a power semiconductor element and can be configured in the same manner as the first semiconductor element 12. The second semiconductor element 13 includes a semiconductor substrate and multiple electrodes 13c and 13d. The electrodes 13c and 13d include a collector electrode and an emitter electrode 13c connected to the power circuit, and multiple signal electrodes 13d connected to the signal circuit. The second semiconductor element 13 is a switching element, and can conduct and interrupt between the collector electrode and the emitter electrode 13c. The collector electrode is located on an upper surface the semiconductor substrate, and the emitter electrode 13c and the signal electrodes 13d are located on a lower surface of the semiconductor substrate.

The first insulating circuit board 20 and the second insulating circuit board 30 face each other with the first semiconductor element 12 and the second semiconductor element 13 interposed therebetween. In particular, the upper surface 20a of the first insulating circuit board 20 faces the lower surfaces of the first semiconductor element 12 and the second semiconductor element 13. Therefore, the first inner conductor plate 24 of the first insulating circuit board 20 is bonded to the emitter electrode 12c of the first semiconductor element 12 and to the emitter electrode 13c of the second semiconductor element 13. On the other hand, the lower surface 30b of the second insulating circuit board 30 faces the upper surfaces of the first semiconductor element 12 and the second semiconductor element 13. Therefore, the second inner conductor plate 34 of the second insulating circuit board 30 is bonded to the collector electrode 12b of the first semiconductor element 12 and to the collector electrode of the second semiconductor element 13. As a result, the first semiconductor element 12 and the second semiconductor element 13 are connected in parallel.

Further, the first conductor circuit pattern 27 of the first insulating circuit board 20 further includes the second conductor line 27b in addition to the first conductor lines 27a. The second conductor line 27b is electrically connected to the second semiconductor element 13. The second conductor line 27b has a first end portion close to the second semiconductor element 13 and a second end portion away from the second semiconductor element 13. The first end portion of the second conductor line 27b is bonded to the second semiconductor element 13, and the second end portion of the second conductor line 27b is bonded to one end portion of the first signal terminal 18.

Even with such a configuration, the first inner conductor plate 24 electrically connected to the emitter electrode 12c of the first semiconductor element 12 and the first conductor lines 27a electrically connected to the signal electrodes 12d are insulated by the first insulating layer 26 interposed between the first inner conductor plate 24 and the first conductor lines 27a. Accordingly, an unintended contact between the first inner conductor plate 24 and the first conductor lines 27a can be restricted. The same can be said for the second conductor line 27b as for the first conductor lines 27a. The first inner conductor plate 24 electrically connected to the emitter electrode 13c of the second semiconductor element 13 and the second conductor line 27b electrically connected to the signal electrode 13d are insulated by the first insulating layer 26 interposed between the first inner conductor plate 24 and the first insulating layer 26. Accordingly, an unintended contact between the first inner conductor plate 24 and the second conductor line 27b can be restricted.

The second conductor line 27b in the fifth modification is common with a part of the first conductor line 27a. According to such a configuration, one or more conductor lines can be shared between the first semiconductor element 12 and the second semiconductor element 13, and the conductor circuit pattern can be configured relatively simply with respect to the number of the semiconductor elements 12 and 13. Accordingly, it is possible to reduce the size of the semiconductor device 10E, for example. At this time, the common conductor line may be, for example, a line that transfers a common control signal (for example, a gate drive signal) to the first semiconductor element 12 and the second semiconductor element 13. In the present modification, the second end portion of the first conductor line 27a and the second end portion of the second conductor line 27b are shared. However, the structure in which the first conductor line 27a and the second conductor line 27b are shared is not limited to this example. At least a part of the second conductor line 27b may be common to at least a part of the first conductor line 27a.

(Sixth Modification)

Figure 17:
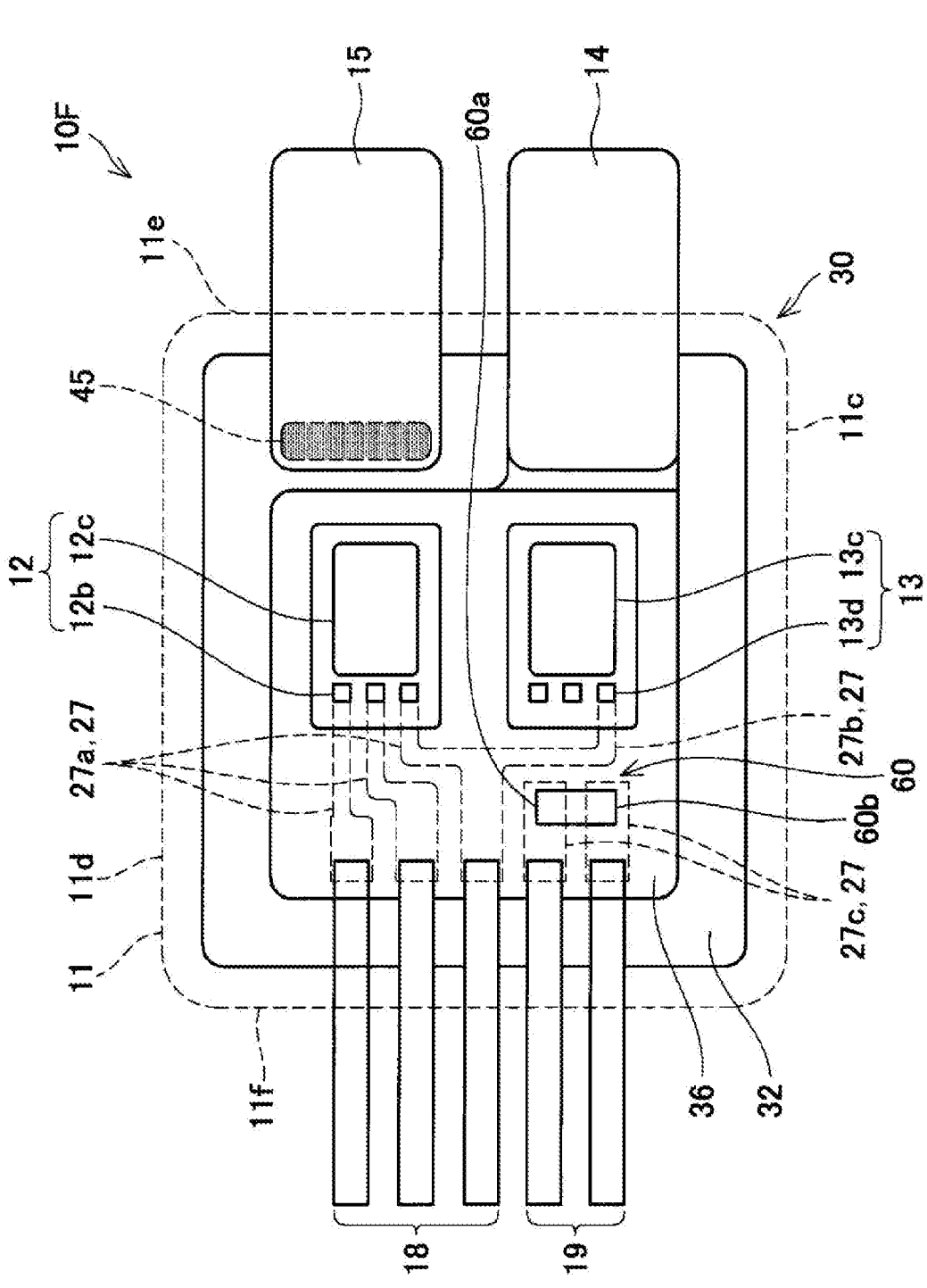
FIG. 17 is a cross-sectional view showing an internal structure of a semiconductor device according to a sixth modification taken along a direction perpendicular to a thickness direction of the semiconductor device.
Figure 18:
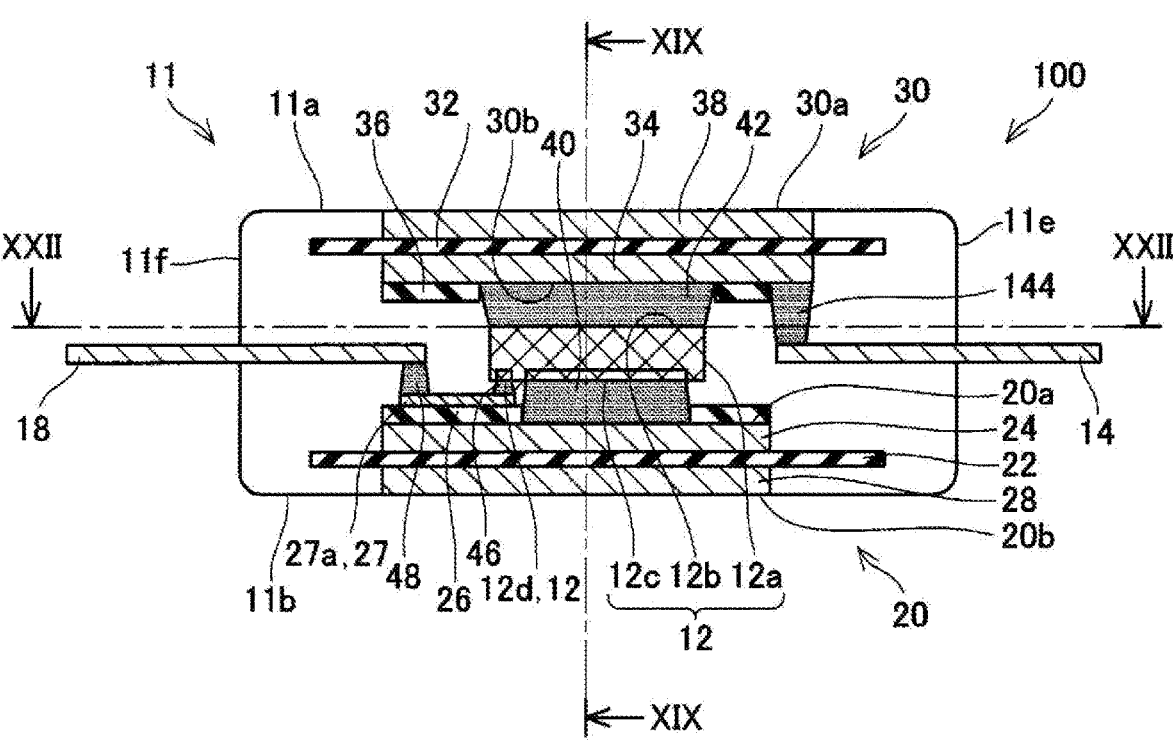
FIG. 18 is a cross-sectional view showing an internal structure of a semiconductor device according to a second embodiment.

A semiconductor device 10F of a sixth modification will be described with reference to FIG. 16. As shown in FIG. 17, the semiconductor device 10F of the sixth modification further includes a thermistor 60 and multiple second signal terminal 19 electrically connected to the thermistor 60, in addition to the configuration of the semiconductor device 10E of the fifth modification. Along with this change, the configuration of the conductor circuit pattern of the first insulating circuit board 20 is partially changed. The conductor circuit pattern further includes third conductor lines 27c. In the semiconductor device 10F of the sixth modification, parts other than the second signal terminal 19 and the third conductor line 27c can be configured in the same manner as the semiconductor device 10 of the fifth modification. In the sixth modification, the same components as the fifth modification are indicated by the same reference numbers, and duplicate description will be omitted.

The semiconductor device 10F of the sixth modification includes the thermistor 60. The thermistor 60 measures the temperatures of the semiconductor elements 12 and 13 by passing a current through the thermistor 60 and measuring the resistance values of both ends 60a and 60b of the thermistor 60. The conductor circuit pattern of the first insulating circuit board 20 has multiple third conductor lines 27c. In the present embodiment, the conduct circuit pattern has two third conductor lines 27c. Each of the third conductor lines 27c is electrically insulated from the first semiconductor element 12 and the second semiconductor element 13. A first end portion of one of the third conductor lines 27c is connected to a first end 60a of the thermistor 60 and a first end portion of the other one of the third conductor lines 27c is connected to a second end 60b of the thermistor 60. The semiconductor device 10F includes the second signal terminals 19. A second end portion of the one of the third conductor lines 27c is connected to one of the second signal terminals 19, and the second end portion of the other one of the third conductor lines 27c is connected to the other one of the second signal terminals 19. Therefore, each of the second signal terminal 19 is electrically connected to the thermistor 60 via the third conductor line 27c. As a result, in the semiconductor device 10F, the average temperature of the two semiconductor elements 12 and 13 can be measured relatively accurately. For example, since it is not necessary to provide a temperature sensor in each of the semiconductor elements 12 and 13, the size of each of the semiconductor elements 12 and 13 can be made relatively small, or the active region of each of the semiconductor elements 12 and 13 can be increased accordingly.

The thermistor 60 is an example of an electric component in the technique disclosed in the present specification. Therefore, the semiconductor device 10F may include other electric components in place of or in addition to the thermistor 60. According to such a configuration, any electric component can be incorporated into the semiconductor device 10F by utilizing the surplus region on the first insulating layer 26. Further, as another embodiment, the electric component may be a drive circuit for driving each of the semiconductor elements 12 and 13.

Second Embodiment

A semiconductor device 100 of a second embodiment will be described with reference to FIGS. 18 to 23. As shown in FIGS. 18 to 23, the semiconductor device 100 further includes a second semiconductor element 113, a joint member 158, and multiple connection terminals 14, 15, 116, 18 and 119 as compared with the semiconductor device 10 of the first embodiment. Along with this change, some of the configurations of the first insulating circuit board 20 and the second insulating circuit board 30 are also been changed. In the semiconductor device 100 of the second embodiment, parts other than the above-described components can be configured in the same manner as the semiconductor device 10 of the first embodiment. In the second embodiment, the same components as those in the first embodiment are indicated by the same reference numbers, and duplicate description will be omitted.

The semiconductor device 100 includes the multiple connection terminals 14, 15, 116, 18 and 119 whose second ends protrude from the sealing body 11. A first end portion of each of the connection terminals 14, 15, 116, 18, and 119 is electrically connected to the first semiconductor element 12 or the second semiconductor element 113 inside the sealing body 11. The connection terminals 14, 15, 116, 18, and 119 include the first power terminal 14, the second power terminal 15, and a third power terminal 116, the multiple first signal terminals 18 and multiple second signal terminals 119. The first power terminal 14 and the second power terminal 15 protrude from the first end surface 11e of the sealing body 11, and the third power terminal 116, the first signal terminals 18 and the second signal terminals 119 protrude from the second end surface 11f of the sealing body 11. The first power terminal 14 can be connected to a positive electrode of an external direct current (DC) power supply, and the second power terminal 15 can be connected to a negative electrode of the external DC power supply. The third power terminal 116 can be connected to a load connected to the power circuit. The first signal terminals 18 and the second signal terminals 119 are connected to an external device such as a control board for controlling the first semiconductor element 12 and the second semiconductor element 113.

The second semiconductor element 113 can be configured in the same manner as the first semiconductor element 12. The second semiconductor element 113 includes a semiconductor substrate 113a and multiple electrodes 113b, 113c, 113d. The electrodes 113b, 113c, 113d include a collector electrode 113b and an emitter electrode 113c connected to the power circuit, and multiple signal electrodes 113d connected to the signal circuit. The collector electrode 113b is located on an upper surface of the semiconductor substrate 113a, and the emitter electrode 113c and the signal electrodes 113d are located on a lower surface of the semiconductor substrate 113a. Although not particularly limited, the second semiconductor element 113 is an RC-IGBT, and the second semiconductor element 113 has an IGBT structure 113e and a diode structure 113f connected in parallel with the IGBT structure 113e. Here, the emitter electrode 113c and the signal electrode 113d are examples of a fourth electrode and a fifth electrode, respectively, in the technique disclosed in the present specification, and the collector electrode 113b is an example of a sixth electrode in the technique disclosed in the present specification.

Figure 19:
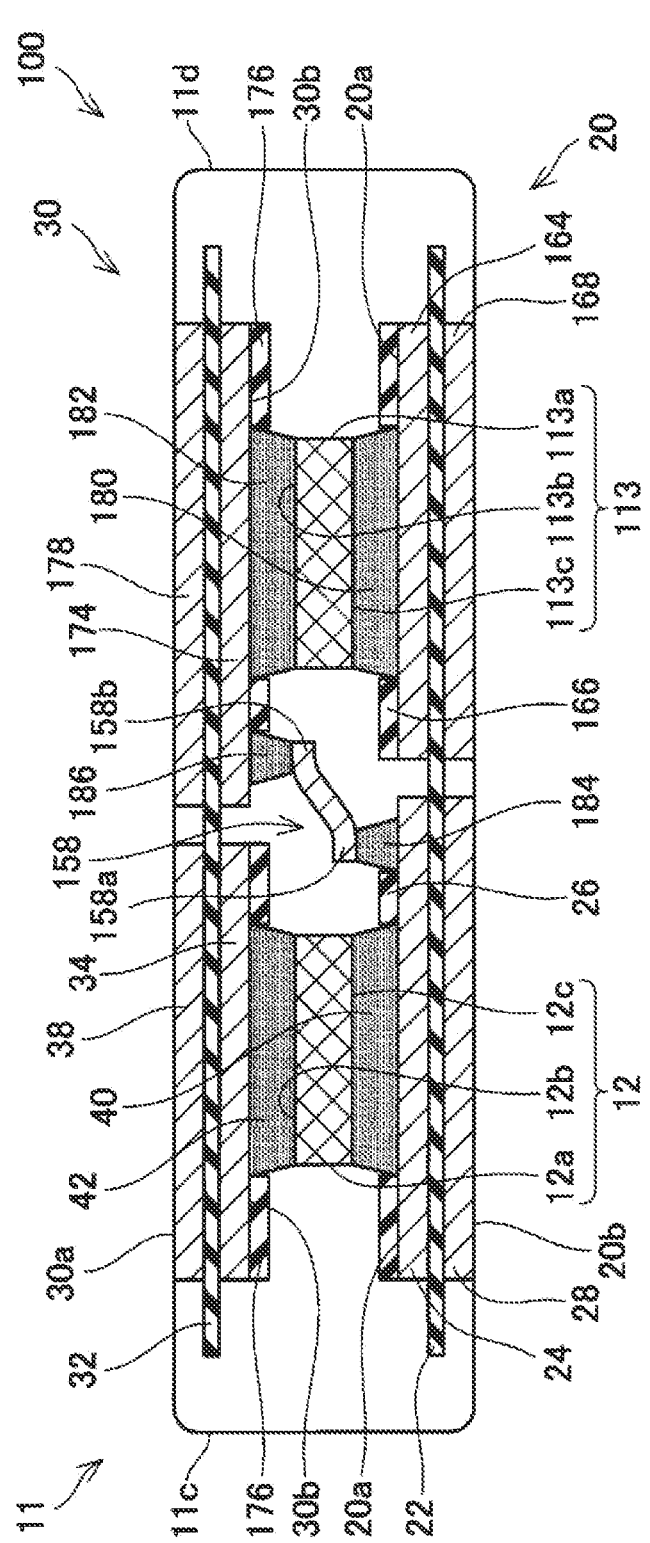
FIG. 19 is a cross sectional view of the semiconductor device taken along line XIX-XIX in FIG. 18.

As shown in FIG. 19, the first insulating circuit board 20 and the second insulating circuit board 30 face each other with the first semiconductor element 12 and the second semiconductor element 113 interposed therebetween. The upper surface 20a of the first insulating circuit board 20 faces the lower surface of the second semiconductor element 113, and is bonded to the emitter electrode 113c of the second semiconductor element 113 via a solder layer 180. The lower surface 30b of the second insulating circuit board 30 faces the upper surface of the second semiconductor element 113, and is bonded to the collector electrode 113b of the second semiconductor element 113 via a solder layer 182. As a result, the first insulating circuit board 20 and the second insulating circuit board 30 are electrically and thermally connected to the second semiconductor element 113 inside the sealing body 11, and constitute a part of the power circuit.

In the first insulating circuit board 20, a third inner conductor plate 164 is disposed on the upper surface of the first ceramic substrate 22 in addition to the first inner conductor plate 24, and a third outer conductor plate 168 is disposed on the lower surface of the first ceramic substrate 22 in addition to the first outer conductor plate 28. Each of the third inner conductor plate 164 and the third outer conductor plate 168 is made of a conductor material. The third inner conductor plate 164 and the third outer conductor plate 168 are electrically insulated by the ceramic substrate 22. The third inner conductor plate 164 is electrically insulated from the first inner conductor plate 24, which is adjacent to the third inner conductor plate 164 on the first ceramic substrate 22. The third inner conductor plate 164 is bonded to the emitter electrode 113c of the second semiconductor element 113 via the solder layer 180. Accordingly, the third inner conductor plate 164 of the first insulating circuit board 20 is electrically connected to the emitter electrode 113c of the second semiconductor element 113. The third inner conductor plate 164 is an example of a third conductor plate in the technique disclosed in the present specification.

Similarly, a fourth outer conductor plate 178 is disposed on the upper surface of the second ceramic substrate 32 in addition to the second outer conductor plate 38, and a fourth inner conductor plate 174 is disposed on the lower surface of the second ceramic substrate 32 in addition to the second inner conductor plate 34. Each of the fourth inner conductor plate 174 and the fourth outer conductor plate 178 is made of a conductor material. The fourth inner conductor plate 174 and the fourth outer conductor plate 178 are electrically insulated by the second ceramic substrate 32. The fourth inner conductor plate 174 is electrically insulated from the second inner conductor plate 34, which is adjacent to the fourth inner conductor plate 174 on the second ceramic substrate 32. The fourth inner conductor plate 174 is bonded to the collector electrode 113b of the second semiconductor element 113 via the solder layer 182. Accordingly, the fourth inner conductor plate 174 of the second insulating circuit board 30 is electrically connected to the collector electrode 113b of the second semiconductor element 113. The fourth inner conductor plate 174 is an example of a fourth conductor plate in the technique disclosed in the present specification.

Figure 23:
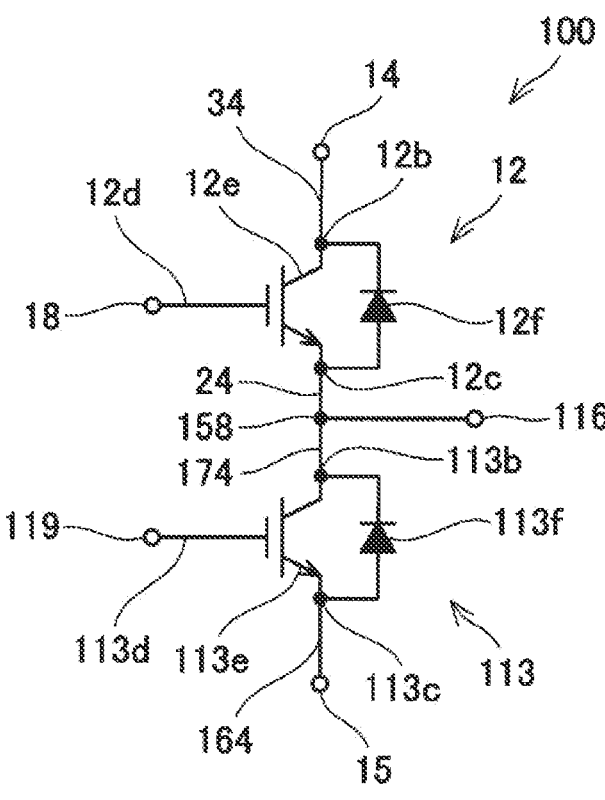
FIG. 23 is an electronic circuit diagram showing a configuration of the semiconductor device according to the second embodiment.

The semiconductor device 100 further includes the joint member 158. The joint member 158 is interposed between the first semiconductor element 12 and the second semiconductor element 113. The joint member 158 electrically connects between the first inner conductor plate 24 and the fourth inner conductor plate 174. Accordingly, the first semiconductor element 12 and the second semiconductor element 113 are connected in series as shown in FIG. 23. Although not particularly limited, the joint member 158 of the present embodiment has a first portion 158a bonded to the first inner conductor plate 24 and a second portion 158b bonded to the fourth inner conductor plate 174. The first portion 158a of the joint member 158 is bonded to the first inner conductor plate 24 via a solder layer 184. The second portion 158b of the joint member 158 is bonded to the fourth inner conductor plate 174 via a solder layer 186. As an example, the joint member 158 is formed as a member integrated with the third power terminal 116. Bonding members between the joint member 158 and the first inner conductor plate 24 and between the joint member 158 and the fourth inner conductor plate 174 are not limited to the solder layers 184 and 186, and other conductive bonding layers may be adopted.

Figure 20:
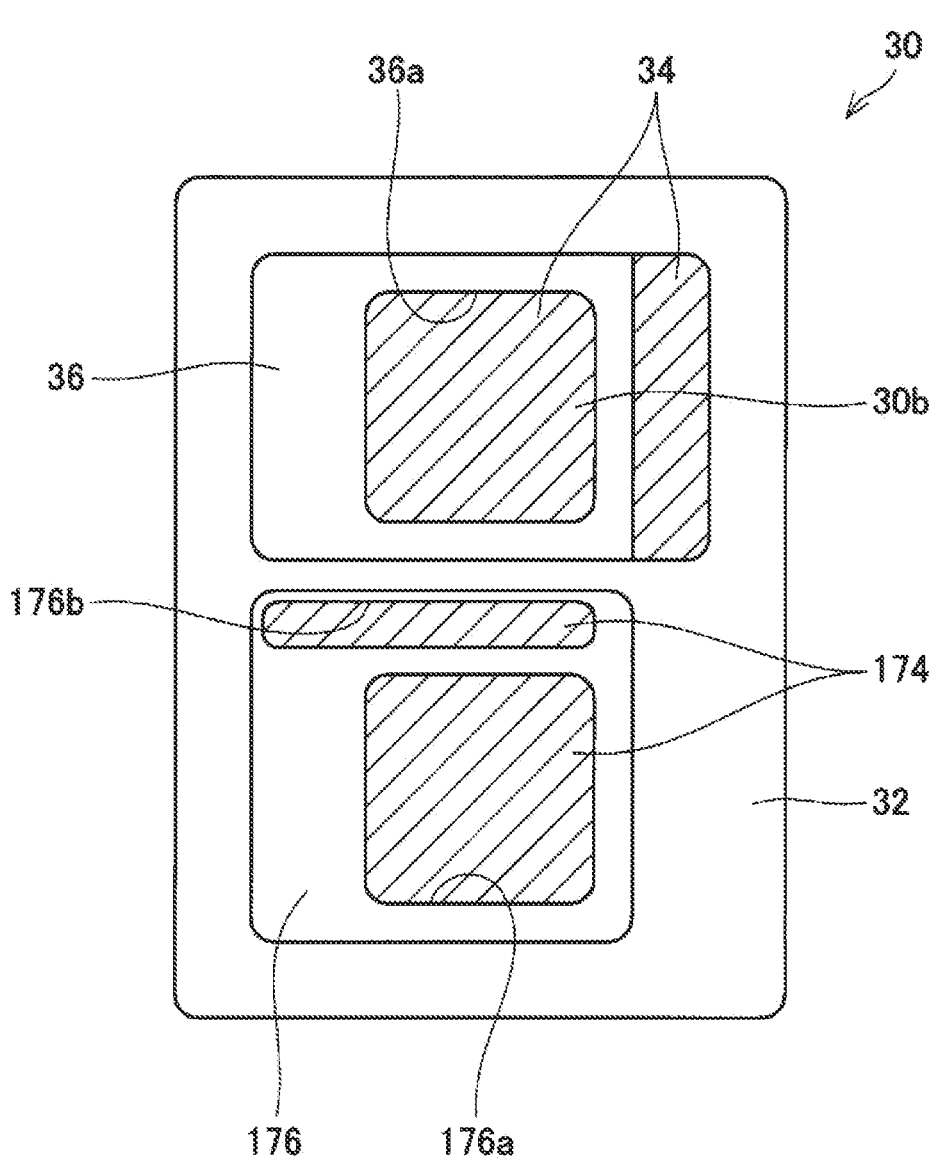
FIG. 20 is a plan view of a lower surface of a second insulating circuit board in the second embodiment.

As shown in FIG. 20, a fourth insulating layer 176 is disposed on the fourth inner conductor plate 174 of the second insulating circuit board 30. The fourth insulating layer 176 covers a part of the fourth inner conductor plate 174. As an example, the fourth insulating layer 176 has two openings 176a and 176b that expose the fourth insulating layer 176 of the second insulating circuit board 30. The collector electrode 113b of the second semiconductor element 113 is bonded to the fourth inner conductor plate 174 via the solder layer 182 through one opening 176a of the fourth insulating layer 176. The second portion 158b of the joint member 158 is bonded to the fourth inner conductor plate 174 via the solder layer 186 through the other opening 176b of the fourth insulating layer 176. Furthermore, one end of the first power terminal 14 is bonded to the second inner conductor plate 34 of the second insulating circuit board 30 via a solder layer 144. Although not particularly limited, the second insulating layer 36 or the fourth insulating layer 176 may be disposed on the second inner conductor plate 34 and the fourth inner conductor plate 174 at a portion other than the bonding regions.

Figure 21:
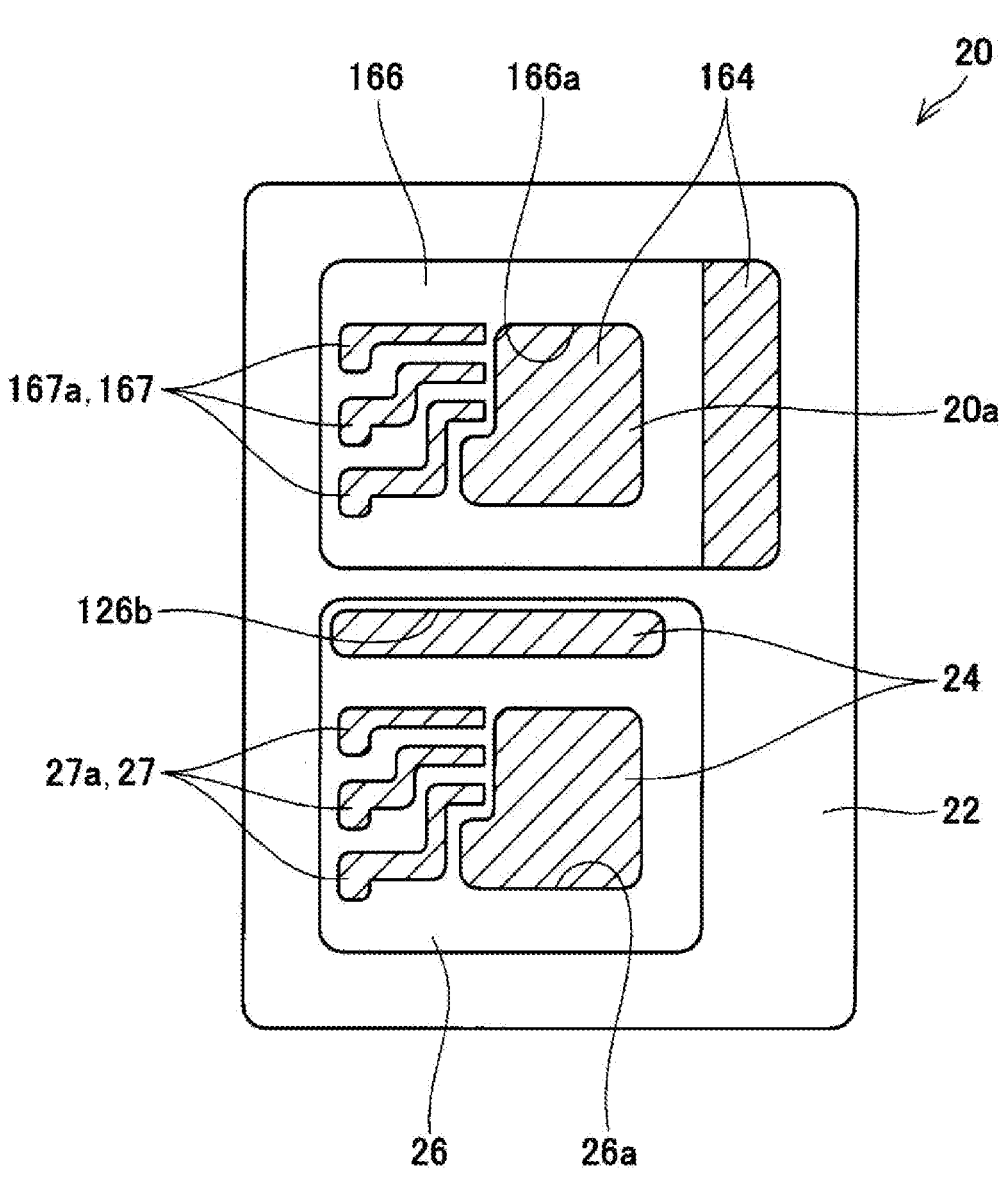
FIG. 21 is a plan view of an upper surface of a first insulating circuit board in the second embodiment.

As shown in FIG. 21, a third insulating layer 166 is disposed on the third inner conductor plate 164 of the first insulating circuit board 20. The third insulating layer 166 covers a part of the third inner conductor plate 164. As an example, the third insulating layer 166 has an opening 166a that exposes the third inner conductor plate 164. The emitter electrode 113c of the second semiconductor element 113 is bonded to the third inner conductor plate 164 via the solder layer 180 through the opening 166a of the third insulating layer 166. One end of the second power terminal 15 is bonded to the third inner conductor plate 164 via a solder layer 145. The first insulating layer 26 further has an opening 126b that exposes the first inner conductor plate 24. The first portion 158a of the joint member 158 is joined to the first inner conductor plate 24 via the solder layer 184 through the opening 126b of the first insulating layer 26. Although not particularly limited, the first insulating layer 26 or the third insulating layer 166 may be provided on the first inner conductor plate 24 and the third inner conductor plate 164 in a portion other than the bonding regions. Each of the third insulating layer 166 and the fourth insulating layer 176 described above is made of a material having an insulating property, and is made of a resin material such as polyimide.

The first insulating circuit board 20 further has a second conductor circuit pattern 167. The second conductor circuit pattern 167 is disposed on the third insulating layer 166. Although not particularly limited, the second conductor circuit pattern 167 is located inside the sealing body 11. The second conductor circuit pattern 167 includes multiple second conductor lines 167a. The second conductor lines 167a are electrically connected to the second semiconductor element 113. Each of the second conductor line 167a has a first end portion close to the second semiconductor element 113 and a second end portion away from the second semiconductor element 113. The first end portions of the second conductor lines 167a are bonded to the signal electrodes 113d of the second semiconductor element 113 via a solder layer. The second end portions of the second conductor lines 167a are bonded to the first end portions of the second signal terminal 119 via a solder layer. Therefore, each of the second signal terminals 119 is electrically connected to the signal electrode 113d of the second semiconductor element 113 via the second conductor line 167a.

As described above, in the semiconductor device 100 of the second embodiment, the second conductor circuit pattern 167 is also disposed on the third inner conductor plate 164 via the third insulating layer 166. The emitter electrode 113c of the second semiconductor element 113 is electrically connected to the third inner conductor plate 164, and the signal electrodes 113d of the second semiconductor element 113 are electrically connected to the second conductor lines 167a of the second conductor circuit pattern 167, respectively. According to such a configuration, the third inner conductor plate 164 electrically connected to the emitter electrode 113c of the second semiconductor element 113 and the second conductor lines 167a electrically connected to the signal electrodes 113d are insulated by the third insulating layer 166 interposed between the third inner conductor plate 164 and the second conductor lines 167a. As a result, unintended contact between the first inner conductor plate 24 and the first conductor lines 27a can be restricted, and unintended contact between the third inner conductor plate 164 and the second conductor lines 167a can be restricted.

Figure 22:
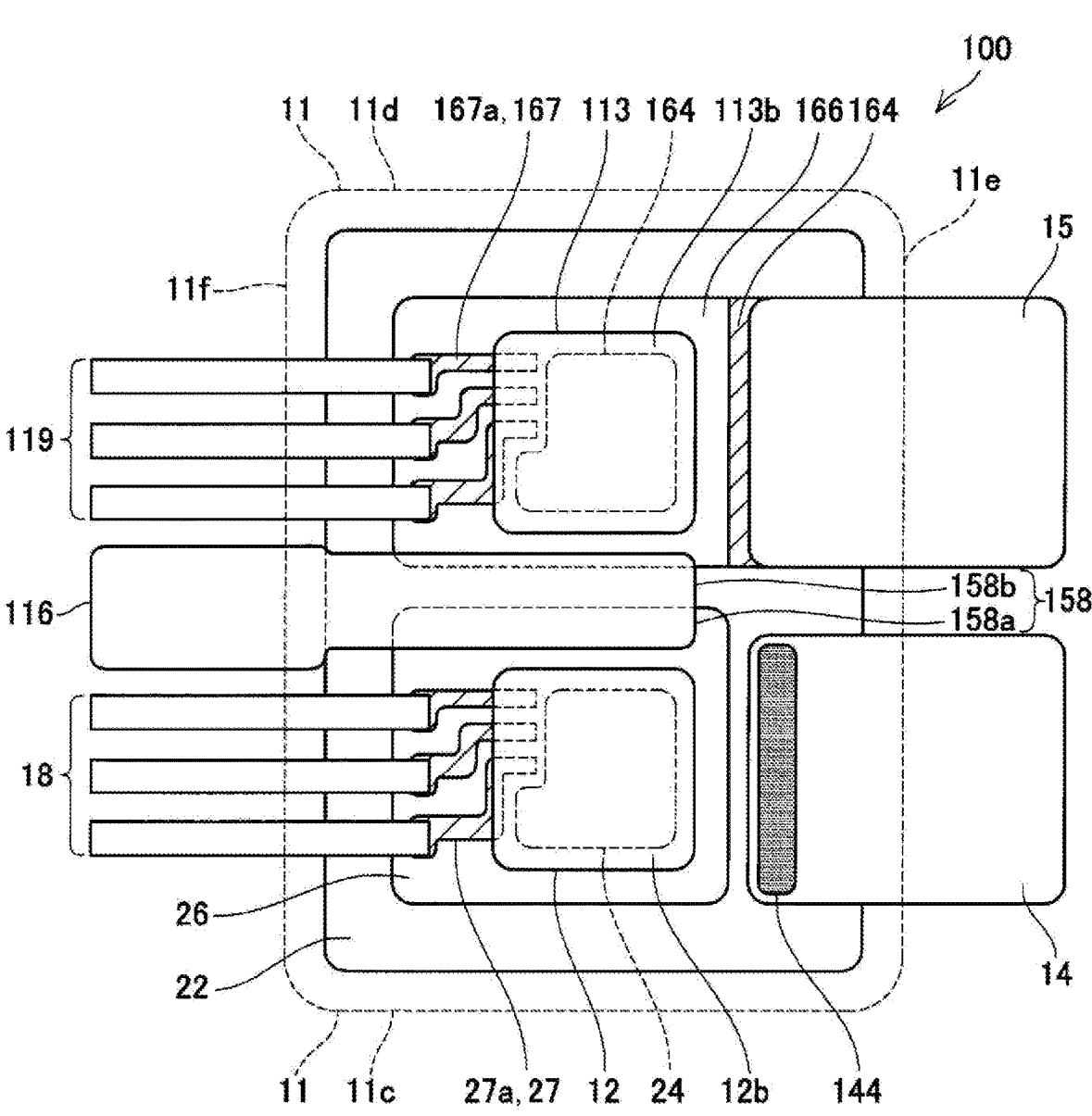
FIG. 22 is a cross-sectional view of the semiconductor device taken along line XXII-XXII in FIG. 18.
Figure 24:
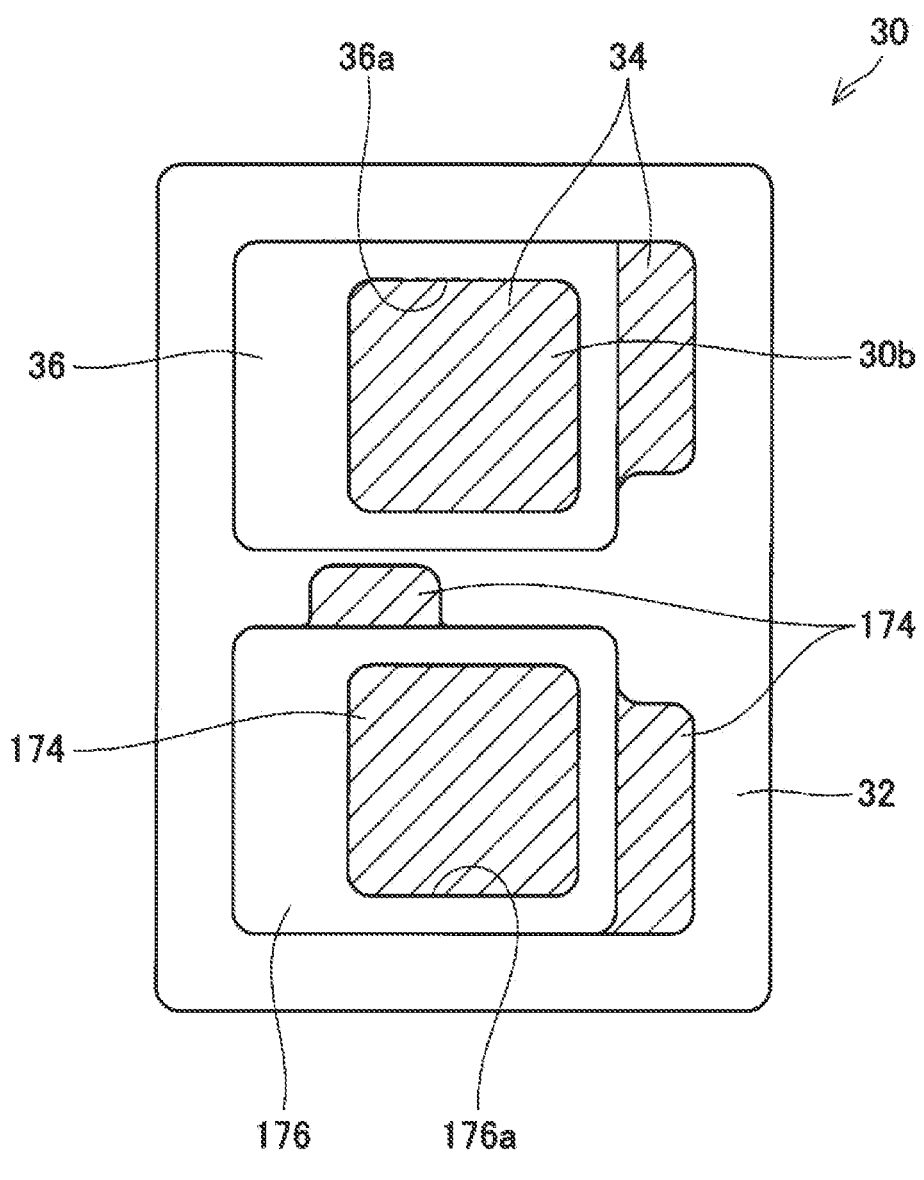
FIG. 24 is a plan view of a lower surface of a second insulating circuit board in a modification of the second embodiment.
Figure 25:
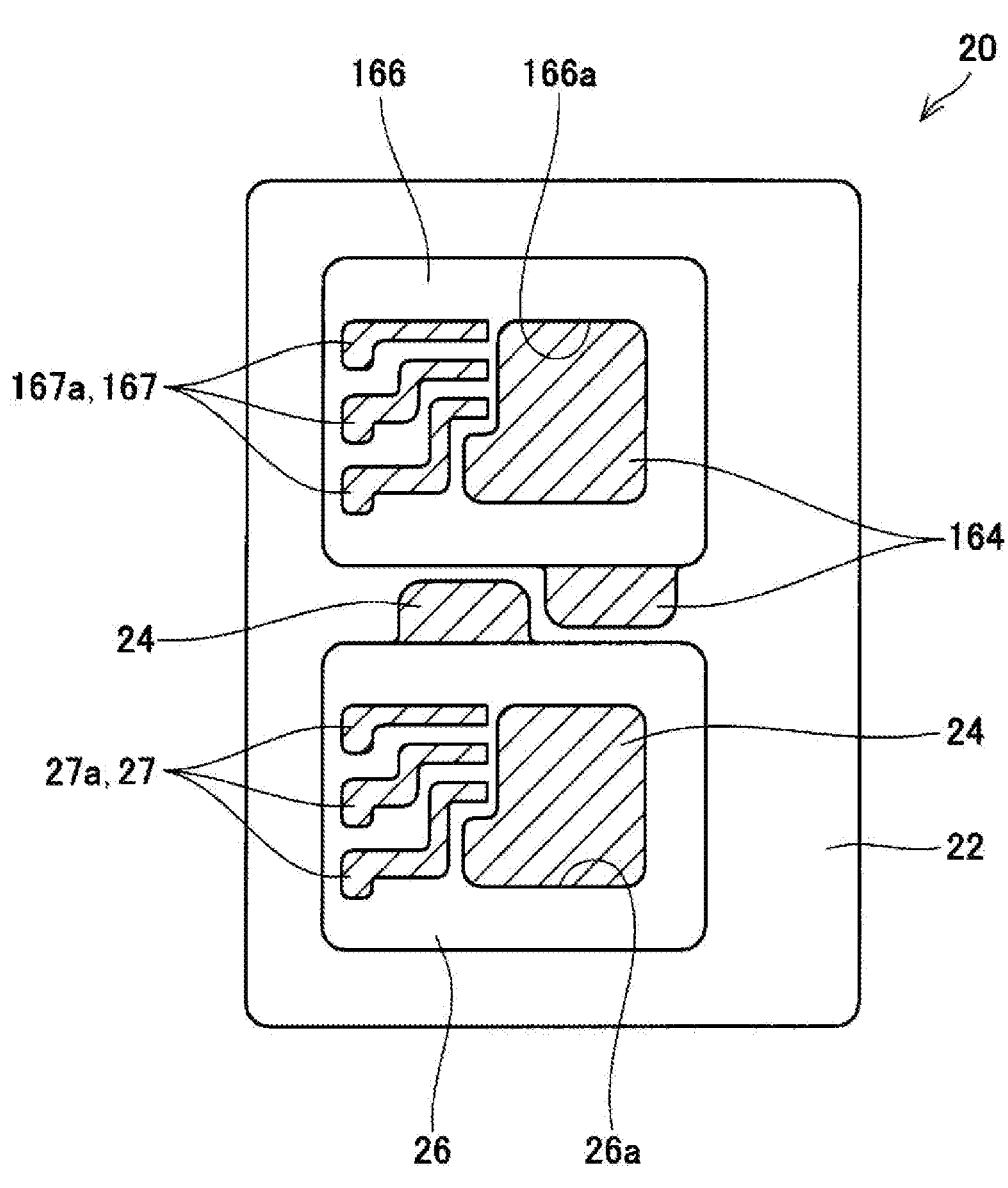
FIG. 25 is a plan view of an upper surface of a first insulating circuit board in the modification of the second embodiment.
Figure 26:
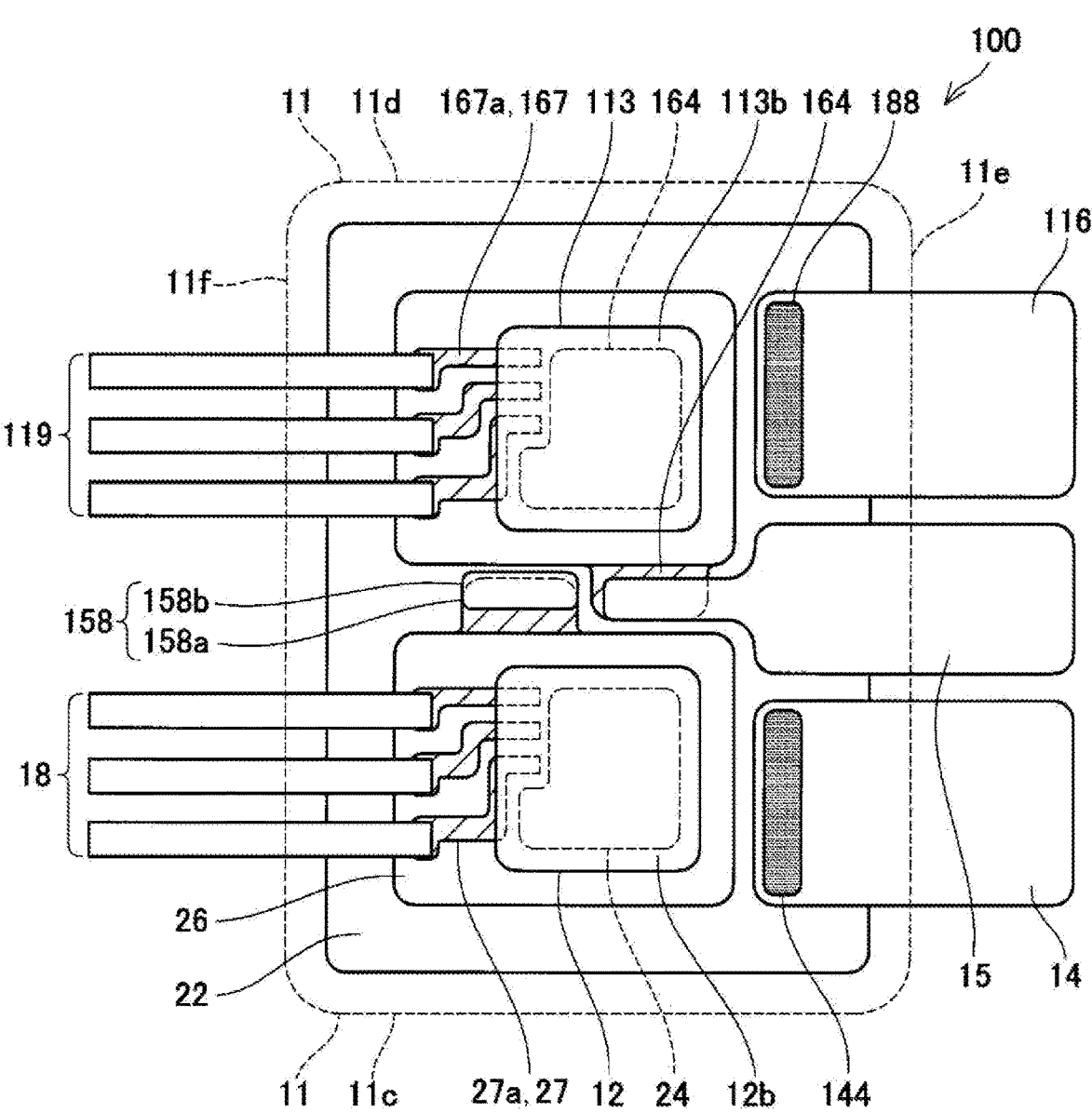
FIG. 26 is a cross-sectional view showing an internal structure of a semiconductor device according to the modification of the second embodiment.

The semiconductor device 100 of the second embodiment is not limited to the structure shown in FIG. 22. For example, as shown in FIG. 24, FIG. 25, and FIG. 26, the joint member 158 may be formed as a separate member from the third power terminal 116. In such a case, the third power terminal 116 may protrude from the first end surface 11e of the sealing body 11, similarly to the first power terminal 14 and the second power terminal 15 as shown in FIG. 26. The third power terminal 116 may be bonded to the fourth inner conductor plate 174 via a solder layer 188.

Although specific examples of the techniques disclosed in the present specification have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. The techniques illustrated in the present specification or drawings can achieve multiple objectives at the same time, and achieving one of the objectives itself has technical usefulness.

What is claimed is:

1. A semiconductor device comprising:
a semiconductor element having a first surface on which a first electrode and a second electrode are disposed, and a second surface opposite to the first surface of the semiconductor element;
a first conductor plate having a first surface facing the first surface of the semiconductor element and electrically connected to the first electrode of the semiconductor element, and a second surface opposite to the first surface of the first conductor plate;
a first insulating layer disposed on the first surface of the first conductor plate and covering a part of the first surface of the first conductor plate;
a conductor circuit pattern disposed on the first insulating layer;
a second conductor plate having a first surface facing the second surface of the semiconductor element, and a second surface opposite to the first surface of the second conductor plate;
a second insulating layer disposed on the first surface of the second conductor plate and covering a part of the first surface of the second conductor plate;
a connection terminal; and
a spacer formed integrally with or separated from the connection terminal, wherein
the conductor circuit pattern has at least one conductor line electrically connected to the semiconductor element,
the at least one conductor line includes a conductor line electrically connected to the second electrode,
the semiconductor element further includes a third electrode disposed on the second surface of the semiconductor element, and electrically connected to the first surface of the second conductor plate,
the connection terminal is electrically connected to the at least one conductor line,
one end portion of the connection terminal is located between the at least one conductor line and the second insulating layer and is bonded to the at least one conductor line,
the spacer includes:
a first convex portion protruding from the one end portion of the connection terminal toward the at least one conductor line; and
a second convex portion protruding from a position opposite to the first convex portion at the one end portion of the connection terminal toward the second insulating layer, and
the spacer is disposed between the one end portion of the connection terminal and the second insulating layer.

2. The semiconductor device according to claim 1, wherein
the conductor circuit pattern has a thickness smaller than a thickness of the first conductor plate.

3. The semiconductor device according to claim 1, wherein
the at least one conductor line has a first end portion electrically connected to the semiconductor element and a second end portion electrically connected to the connection terminal, and
a width of the second end portion of the at least one conductor line is larger than a width of the first end portion of the at least one conductor line.

4. The semiconductor device according to claim 1, wherein the at least one conductor line includes two conductor lines extending in parallel, the two conductor lines have first end portions electrically connected to the semiconductor element and second end portions opposite to the first end portions, and a center distance between centers of the second end portions of the two conductor lines is larger than a center distance between centers of the first end portions of the two conductor lines.

5. The semiconductor device according to claim 1, wherein the first insulating layer has an opening that exposes the first surface of the first conductor plate, and the first electrode of the semiconductor element is bonded to the first surface of the first conductor plate through the opening of the first insulating layer.

6. The semiconductor device according to claim 1, wherein the first electrode is a power electrode of the semiconductor element, and the second electrode is a signal electrode of the semiconductor element.

7. The semiconductor device according to claim 1, further comprising an insulating cover partially covering the at least one conductor line.

8. The semiconductor device according to claim 1, wherein the first insulating layer of the first conductor plate has a mark at a position corresponding to a peripheral edge of the semiconductor element for positioning of the semiconductor element.

9. The semiconductor device according to claim 1, further comprising an electric component disposed on the first insulating layer, wherein the conductor circuit pattern further includes a conductor line connected to the electric component.

10. The semiconductor device according to claim 9, wherein the electric component includes a thermistor.

11. The semiconductor device according to claim 1, further comprising an insulator substrate on which the first conductor plate is disposed.

12. The semiconductor device according to claim 1, further comprising a conductor film disposed on the second insulating layer, wherein the spacer is bonded to the conductor film via a bonding layer.

13. The semiconductor device according to claim 1, wherein the semiconductor element is a first semiconductor element, and the at least one conductor line is at least one first conductor line, the semiconductor device further comprising:

a second semiconductor element having a first surface on which a fourth electrode and a fifth electrode are disposed and a second surface opposite to the first surface of the second semiconductor element, wherein the first surface of the first conductor plate faces the first surface of the second semiconductor element and is electrically connected to the fourth electrode of the second semiconductor element, the conductor circuit pattern further includes at least one second conductor line electrically connected to the second semiconductor element, and the at least one second conductor line includes a conductor line electrically connected to the fifth electrode.

14. The semiconductor device according to claim 13, wherein a part of the at least one second conductor line is shared with a part of the at least one first conductor line.

15. The semiconductor device according to claim 1, wherein the semiconductor element is a first semiconductor element, the conductor circuit pattern is a first conductor circuit pattern, and the at least one conductor line is at least one first conductor line, the semiconductor device further comprising:

a second semiconductor element having a first surface on which a fourth electrode and a fifth electrode are disposed, and a second surface opposite to the first surface of the second semiconductor element and on which a sixth electrode is disposed;

a third conductor plate having one surface that faces the first surface of the second semiconductor element and is electrically connected to the fourth electrode of the semiconductor element;

a fourth conductor plate having one surface that faces the second surface of the second semiconductor element and is electrically connected to the sixth electrode;

a joint member located between the first conductor plate and the fourth conductor plate and electrically connecting the first conductor plate and the fourth conductor plate;

a third insulating layer disposed on the one surface of the third conductor plate and covering a part of the one surface of the third conductor plate; and a second conductor circuit pattern disposed on the third insulating layer, wherein the second conductor circuit pattern includes at least one second conductor line electrically connected to the second semiconductor element, and the at least one second conductor line includes a conductor line electrically connected to the fifth electrode.

16. The semiconductor device according to claim 15, further comprising an insulator substrate on which the first conductor plate and the third conductor plate are disposed.

17. The semiconductor device according to claim 1, wherein the spacer is disposed in direct contact on the one end portion of the connection terminal, and disposed in a thickness direction of the semiconductor device between the one end portion of the connection terminal and the second insulating layer.

18. The semiconductor device according to claim 1, further comprising a bonding layer, and a conductor film disposed on the second insulating layer, wherein the spacer protrudes from the one end portion of the connection terminal in a thickness direction of the semiconductor device, the spacer is bonded to the conductor film via the bonding layer, and the connection terminal is separated from and spaced apart from the bonding layer by the spacer.

19. The semiconductor device according to claim 1, wherein the spacer includes a plurality of first convex portions protruding from the one end portion of the connection terminal toward the at least one conductor line and including the first convex portion, and a plurality of second convex portions protruding respectively from positions opposite to the plurality of first convex portions at the one end portion of the connection terminal toward the second insulating layer and including the second convex portion.

20. The semiconductor device according to claim 19, wherein the connection terminal is fixed in a stacking direction of the semiconductor device to the first insulating layer via the plurality of first convex portions, and the connection terminal is fixed in the stacking direction to the second insulating layer via the plurality of second convex portions.

* * * * *